(12) United States Patent
Larson, III et al.

(10) Patent No.: US 9,679,765 B2
(45) Date of Patent: Jun. 13, 2017

(54) METHOD OF FABRICATING RARE-EARTH DOPED PIEZOELECTRIC MATERIAL WITH VARIOUS AMOUNTS OF DOPANTS AND A SELECTED C-AXIS ORIENTATION

(71) Applicant: Avago Technologies General IP (Singapore) Pte. Ltd., Singapore (SG)

(72) Inventors: John D. Larson, III, Palo Alto, CA (US); Jyrki Kaitila, Riemerling (DE); Stefan Bader, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 387 days.

(21) Appl. No.: 14/161,564

(22) Filed: Jan. 22, 2014

(65) Prior Publication Data

US 2014/0132117 A1    May 15, 2014

Related U.S. Application Data

(63) Continuation-in-part of application No. 13/428,474, filed on Mar. 23, 2012, now Pat. No. 8,673,121, and
(Continued)

(51) Int. Cl.
| | |
|---|---|
| H01L 21/02 | (2006.01) |
| C23C 14/06 | (2006.01) |
| H03H 3/02 | (2006.01) |
| H03H 9/02 | (2006.01) |
| H03H 9/58 | (2006.01) |

(Continued)

(52) U.S. Cl.
CPC ...... *H01L 21/02518* (2013.01); *C23C 14/025* (2013.01); *C23C 14/0617* (2013.01); *C23C 14/3414* (2013.01); *H03H 3/02* (2013.01); *H03H 9/02015* (2013.01); *H03H 9/173* (2013.01); *H03H 9/175* (2013.01); *H03H 9/583* (2013.01); *H03H 9/587* (2013.01)

(58) Field of Classification Search
CPC ....... H04R 17/00; B06B 1/0603; H01L 41/22; H01L 41/45; H01L 21/02518; C23C 14/025; C23C 14/3414; H03H 3/02; H03H 9/173; H03H 9/583
USPC ................................ 310/322, 348, 357, 359
See application file for complete search history.

(56) References Cited

U.S. PATENT DOCUMENTS

| | | | |
|---|---|---|---|
| 3,200,354 A | 8/1965 | White | |
| 4,419,202 A | 12/1983 | Gibson | |

(Continued)

OTHER PUBLICATIONS

NPL of list of Rare Earth Elements, Rare Element Resources.*
(Continued)

*Primary Examiner* — Shawki S Ismail
*Assistant Examiner* — Bryan Gordon

(57) ABSTRACT

A method of fabricating a rare-earth element doped piezoelectric material having a first component, a second component and the rare-earth element. The method includes: providing a substrate; initially flowing hydrogen over the substrate; after the initially flowing of the hydrogen over the substrate, flowing the first component to form the rare-earth element doped piezoelectric material over a surface of a target, the target comprising the rare-earth metal in a certain atomic percentage; and sputtering the rare-earth element doped piezoelectric material from the target on the substrate.

21 Claims, 21 Drawing Sheets

Related U.S. Application Data a continuation-in-part of application No. 13/286,051, filed on Oct. 31, 2011, now Pat. No. 8,796,904, and a continuation-in-part of application No. 12/692,108, filed on Jan. 22, 2010, now Pat. No. 9,243,316.

(51) Int. Cl.
*C23C 14/02* (2006.01)
*C23C 14/34* (2006.01)
*H03H 9/17* (2006.01)

(56) References Cited

U.S. PATENT DOCUMENTS

| | | |
|---|---|---|
| 5,587,620 A | 12/1996 | Ruby et al. |
| 5,616,208 A | 4/1997 | Lee |
| 5,873,153 A | 2/1999 | Ruby et al. |
| 6,060,818 A | 5/2000 | Ruby et al. |
| 6,099,700 A | 8/2000 | Lee et al. |
| 6,107,721 A | 8/2000 | Lakin |
| 6,372,098 B1 | 4/2002 | Newcomb |
| 6,384,697 B1 | 5/2002 | Ruby |
| 6,441,539 B1 | 8/2002 | Kitamura et al. |
| 6,507,983 B1 | 1/2003 | Ruby et al. |
| 6,709,776 B2 | 3/2004 | Noguchi et al. |
| 6,828,713 B2 | 12/2004 | Bradley et al. |
| 6,927,651 B2 | 8/2005 | Larson, III et al. |
| 6,936,837 B2 | 8/2005 | Yamada et al. |
| 6,987,433 B2 | 1/2006 | Larson, III et al. |
| 7,091,649 B2 | 8/2006 | Larson, III et al. |
| 7,098,573 B2 | 8/2006 | Stommer |
| 7,275,292 B2 | 10/2007 | Ruby et al. |
| 7,280,007 B2 | 10/2007 | Feng et al. |
| 7,345,410 B2 | 3/2008 | Grannen et al. |
| 7,358,831 B2 | 4/2008 | Larson, III et al. |
| 7,388,454 B2 | 6/2008 | Ruby et al. |
| 7,420,320 B2 | 9/2008 | Sano et al. |
| 7,515,018 B2 | 4/2009 | Handtmann et al. |
| 7,629,865 B2 | 12/2009 | Ruby |
| 7,642,693 B2 | 1/2010 | Akiyama et al. |
| 7,714,684 B2 | 5/2010 | Ruby et al. |
| 7,758,979 B2 | 7/2010 | Akiyama et al. |
| 7,791,434 B2 | 9/2010 | Fazzio et al. |
| 7,889,024 B2 | 2/2011 | Bradley et al. |
| 7,977,850 B2 | 7/2011 | Allah et al. |
| 8,188,810 B2 | 5/2012 | Fazzio |
| 8,248,185 B2 | 8/2012 | Choy |
| 8,575,819 B1 | 11/2013 | Bhugra et al. |
| 8,673,121 B2 | 3/2014 | Larson et al. |
| 9,225,313 B2 | 12/2015 | Bradley et al. |
| 9,450,561 B2 | 9/2016 | Choy et al. |
| 2002/0135270 A1* | 9/2002 | Ballandras ......... H03H 9/02574 310/313 R |
| 2002/0190814 A1 | 12/2002 | Yamada et al. |
| 2003/0052000 A1 | 3/2003 | Segal |
| 2003/0067369 A1* | 4/2003 | Nakano ................. H03H 3/08 333/193 |
| 2003/0155574 A1 | 8/2003 | Doolittle |
| 2004/0061572 A1* | 4/2004 | Nakamura ......... H03H 9/02929 333/133 |
| 2005/0146401 A1* | 7/2005 | Tilmans ............. H03H 9/02102 333/187 |
| 2005/0275696 A1* | 12/2005 | Miyazawa ........... B41J 2/14233 347/72 |
| 2006/0185139 A1* | 8/2006 | Larson ................. H03H 9/132 29/25.35 |
| 2007/0205850 A1 | 9/2007 | Jamneala et al. |
| 2007/0284971 A1* | 12/2007 | Sano .................. H03H 9/02094 310/364 |
| 2008/0165620 A1* | 7/2008 | Sugiura ................ G01S 15/025 367/99 |
| 2008/0315762 A1* | 12/2008 | Hamada ............. C09K 11/7734 313/509 |
| 2010/0013573 A1 | 1/2010 | Umeda |
| 2010/0052815 A1* | 3/2010 | Bradley ................ H03H 9/583 333/133 |
| 2010/0327697 A1 | 12/2010 | Choy et al. |
| 2010/0327994 A1 | 12/2010 | Choy et al. |
| 2011/0114999 A1 | 5/2011 | Yamazaki et al. |
| 2011/0121689 A1 | 5/2011 | Grannen et al. |
| 2011/0180391 A1 | 7/2011 | Larson et al. |
| 2011/0204997 A1 | 8/2011 | Elbrecht et al. |
| 2011/0248633 A1 | 10/2011 | Nauman |
| 2011/0266917 A1 | 11/2011 | Metzger et al. |
| 2012/0000766 A1 | 1/2012 | Teshigahara |
| 2012/0050236 A1 | 3/2012 | Lo et al. |
| 2012/0177816 A1 | 7/2012 | Larson, III et al. |
| 2012/0293278 A1* | 11/2012 | Burak ................. H03H 9/1007 333/189 |
| 2012/0326807 A1 | 12/2012 | Choy et al. |
| 2013/0127300 A1 | 5/2013 | Umeda et al. |
| 2014/0132117 A1 | 5/2014 | Larson |
| 2014/0354109 A1 | 12/2014 | Grannen |
| 2015/0311046 A1 | 10/2015 | Yeh et al. |

OTHER PUBLICATIONS

"Co-pending U.S. Appl. No. 13/161,946, filed Jun. 16, 2011".

Chen, "Fabrication and Characterization of ALN Thin Film Bulk Acoustic Wave Resonator", Dissertation, University of Pittsburgh School of Engineering, 2006.

Martin, et al., "Re-growth of C-Axis Oriented AlN Thin Films", IEEE Ultrasonics Symposium, 2006, 169-172.

Martin, et al., "Shear Mode Coupling and Tilted Gram Growth of AIN Thin Films in BAW Resonators", IEEE Transactions on Ultrasonics, Ferroelectrics, and Frequency Control, vol. 53, No. 7, Jul. 2006, 1339-1343.

Chen, , "Fabrication and Characterization of ALN Thin Film Bulk Acoustic Wave Resonator", *Dissertation, University of Pittsburgh School of Engineering* 2006.

Martin, et al., "Re-growth of C-Axis Oriented AlN Thin Films", *IEEE Ultrasonics Symposium* 2006 , 169-172.

Martin, et al., "Shear Mode Coupling and Tilted Gram Growth of AIN Thin Films in BAW Resonators", *IEEE Transactions on Ultrasonics, Ferroelectrics and Frequency Control*, vol. 53, No. 7 Jul. 2006 , 1339-1343.

Ranjan et al. "Strained Hexagonal ScN: A Material with Unusual Structural and Optical Properties," Physical Review Letters, Jun. 27, 2003 vol. 90, No. 25, The American Physical Society, USA.

Farrer et al., "Properties of hexagonal ScN versus wurtzite GaN and InN," Physical Review B, Nov. 20, 2002 vol. 66, No. 20, The American Physical Society, USA.

Constantin et al., "Composition-dependent structural properties in ScGaN alloy films: A combined experimental and theoretical study," Journal of Applied Physics, Dec. 16, 2005 vol. 98, No. 12, American Institute of Physics, USA.

Akiyama et al., "Enhancement of piezoelectric response in scandium aluminum nitride alloy thin films prepared by dual reactive cosputtering," Advanced Materials, 2009, vol. 21, pp. 593-596, Japan.

Suzuki et al, "Influence of shadowing effect on shear mode acoustic properties in the c-axis tilted AlN films," IEEE Ultrasonics Symposium (IUS), 2010, pp. 1478-1481.

Yanagitani et al., "Giant shear mode electromechanical coupling coefficient k12 in c-axis tilted ScAIN films," IEEE Ultrasonics Symposium (IUS), 2010.

"Ferroelectricity", Wikipedia article [retrieved on Sep. 22, 2016]. Retrieved from the Internet: <https://en.wikipedia.org/wiki/Ferroelectricity>.

Salim, Zaahir, Piezoelectric and ferroelectric materials, published Mar. 6, 2013 [retrieved on Sep. 22, 2016]. Retrieved from the Internet: <http://www.slideshare.net/researcher1234/ferroelectric-and-piezoelectric-materials>.

Hagimura, et al. "Impurity Doping Effect on Electric Field Induced Strains in (Pb, Ba)(Zr, Ti)O3", 1990 IEEE 7th International Symposium on Applications in Ferroelectrics, Jun. 6-8, 1990, p. 185-188 and a 1 page IEEE Xplore abstract.

(56) References Cited

OTHER PUBLICATIONS

Akiyama et al. "Preparation of scandium aluminum nitride thin films by using scandium aluminum alloy sputtering target and design of experiments", Journal of the Ceramic Society of Japan, 118 (12), 2010, p. 1166-1169.
Moreira et al. "Aluminum scandium nitride thin-film bulk acoustic resonators for wide band applications", vol. 86, Issue 1, Jul. 4, 2011, pp. 23-26.
Zhou et al. "Energetics and electron structures of AlN nanotubes/wires and their potential application as ammonia sensors", Nanotechnology 18 (2007) 424023, p. 1-8.
Dubois et al. "Properties of aluminum nitride thin films for piezoelectric transducers and microwave filter applications", Applied Physics Letters, vol. 74. No. 20, May 17, 1999, p. 1-3.
Kabulski et al. "Erbium Alloyed Aluminum Nitride Films for Piezoelectric Applications", Mater. Res. Soc. Symp. Proc. vol. 1129 © 2009 Materials Research Society, p. 1-5.
Pagan, "Aluminum Nitride Deposition/Characterization & PMEMS/SAW Device Simulation/Fabrication", Lane Department of Computer Science and Electrical Engineering, Morgantown, West Virginia, 2009, p. 1-186.
Restriction Requirement mailed Aug. 18, 2015 in co-pending U.S Appl. No. 14/262,785.
Office Action mailed Nov. 5, 2015 in co-pending U.S. Appl. No. 14/262,785.
Office Action mailed Apr. 6, 2016 in co-pending U.S. Appl. No. 14/262,785.
Advisory Action mailed Jun. 13, 2016 in co-pending U.S. Appl. No. 14/262,785.
Office Action mailed Oct. 21, 2016 in co-pending U.S. Appl. No. 14/262,785.

\* cited by examiner

METHOD OF FABRICATING RARE-EARTH DOPED PIEZOELECTRIC MATERIAL WITH VARIOUS AMOUNTS OF DOPANTS AND A SELECTED C-AXIS ORIENTATION

CROSS-REFERENCE TO RELATED APPLICATIONS

The present application is a continuation-in-part application under 37 C.F.R. §1.53(b) of commonly owned U.S. patent application Ser. No. 12/692,108 to John D. Larson III, et al., entitled "Method of Fabricating a Rare-earth doped piezoelectric material with Selected C-Axis Orientation," and filed on Jan. 22, 2010. The present application is also a continuation-in-part application under 37 C.F.R. §1.53(b) of commonly owned U.S. patent application Ser. No. 13/286,051 (now U.S. Pat. No. 8,796,904) to Dariusz Burak et al., entitled "Bulk Acoustic Resonator Comprising Piezoelectric Layer and Inverse Piezoelectric Layer," filed on Oct. 31, 2011. The present application is also a continuation-in-part application under 37 C.F.R. §1.53(b) of commonly owned U.S. patent application Ser. No. 13/428,474 (now U.S. Pat. No. 8,673,121) to John D. Larson, III et al., entitled "Method of Fabricating Piezoelectric Materials with Opposite C-Axis Orientations," filed on Mar. 23, 2012. Applicants claim priority under 35 U.S.C. §120 from U.S. patent application Ser. No. 12/692,108, and from U.S. patent application Ser. No. 13/286,051, and from U.S. patent application Ser. No. 13/428,474. The entire disclosure of U.S. patent application Ser. No. 12/692,108 and the entire disclosure of U.S. patent application Ser. No. 13/286,051, and the entire disclosure of U.S. patent application Ser. No. 13/428,474 are specifically incorporated herein by reference.

BACKGROUND

In many electronic applications, electrical resonators are used. For example, in many wireless communications devices, radio frequency (RF) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the rare-earth element doped piezoelectric material. These acoustic waves are converted into electrical waves for use in electrical applications.

One type of piezoelectric resonator is a Bulk Acoustic Wave (BAW) resonator. The BAW resonator includes an acoustic stack comprising, inter alia, a layer of rare-earth element doped piezoelectric material disposed between two electrodes. Acoustic waves achieve resonance across the acoustic stack, with the resonant frequency of the waves being determined by the materials in the acoustic stack. One type of BAW resonator comprises a piezoelectric layer for the rare-earth element doped piezoelectric material provided over a cavity. These resonators are often referred to as Film Bulk Acoustic Resonators (FBAR).

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially provide a comparatively compact alternative to certain known resonators.

FBARs may comprise a membrane (also referred to as the acoustic stack) disposed over air. Often, such a structure comprises the membrane suspended over a cavity provided in a substrate over which the membrane is suspended. Other FBARs may comprise the membrane formed over an acoustic mirror formed in the substrate. Regardless of whether the membrane is formed over air or over an acoustic mirror, the membrane comprises a piezoelectric layer disposed over a first electrode, and a second electrode disposed over the piezoelectric layer.

The piezoelectric layer comprises a crystalline structure and a polarization axis. Rare-earth element doped piezoelectric materials either compress or expand upon application of a voltage. By convention, a rare-earth element doped piezoelectric material that compresses when a voltage of a certain polarity is applied is referred to as compression-positive ($C_P$) material, whereas a rare-earth element doped piezoelectric material that expands upon application of the voltage is referred to as a compression-negative ($C_N$) material. The polarization axis of $C_P$ rare-earth element doped piezoelectric material is antiparallel to the polarization axis of $C_N$ material.

An FBAR is a polarity-dependent device as a result of polarity dependence of the rare-earth element doped piezoelectric material that constitutes part of the FBAR. A voltage of a given polarity applied between the electrodes of the FBAR will cause the thickness of the FBAR to change in a first direction, whereas the same voltage of the opposite polarity will cause the thickness of the FBAR to change in a second direction, opposite the first direction. (The thickness of the FBAR is the dimension of the FBAR between the electrodes.) For example, a voltage of the given polarity will cause the thickness of the FBAR to increase whereas a voltage of the opposite polarity will cause the FBAR to decrease. Similarly, a mechanical stress applied to the FBAR that causes the thickness of the FBAR to change in a first direction will generate a voltage of the given polarity between the electrodes of the FBAR, whereas a mechanical stress that causes the thickness of the FBAR to change in a second direction, opposite the first direction, will generate a voltage of the opposite polarity between the electrodes of the FBAR. As such, a mechanical stress applied to the FBAR that causes the thickness of the FBAR to increase will generate a voltage of the given polarity, whereas a mechanical stress that causes the thickness of the FBAR to decrease will generate a voltage of the opposite polarity.

The piezoelectric layer of an FBAR is often grown over a first electrode and beneath a second electrode. The orientation of the C-axis can be governed by the first layer formed over the first electrode. For example, in growing scandium-doped aluminum nitride (AlScN) with a $C_P$ layer orientation, the formation of a native oxide layer over the first electrode (e.g., Mo) is believed to cause the first layer of the piezoelectric crystal to be Al. Ultimately, the crystalline orientation of the AlScN formed results in the piezoelectric layer's having $C_P$ orientation and its attendant properties. Growth of $C_N$ piezoelectric layers (e.g., AlScN) by known methods has proven to be more difficult. It is believed that nitrogen and oxygen may be adsorbed at the surface of the first electrode, with the forming of a layer of Al over this adsorbed material. As such, rather than forming the desired $C_N$ piezoelectric layer, $C_P$ rare-earth element doped piezoelectric material is formed.

In certain applications, it is desirable to be able to select the orientation of the rare-earth element doped piezoelectric material, and to fabricate both $C_P$ rare-earth element doped piezoelectric material and $C_N$ rare-earth element doped piezoelectric material on the same structure. For example, in certain applications it is useful to provide a single-ended input to a differential output. One known resonator structure having a differential output comprises coupled mode resonators. Filters based on coupled mode acoustic resonators are often referred to as coupled resonator filters (CRFs). CRFs have been investigated and implemented to provide improved passband and isolation of the transmit band and receive band of duplexers, for example. One topology for CRFs comprises an upper FBAR and a lower FBAR. The two electrodes of one of the FBARs comprise the differential outputs, and one of the inputs to the lower resonator provides the single-ended input. The second electrode provides the ground for the device. However, while the stacked-FBAR CRF shows promise from the perspective of improved performance and reduced area or footprint due to its vertical nature, in order to attain this structure, the orientation of the compression axes (C-axes) of individual rare-earth element doped piezoelectric materials must be tailored to the application. For example, it may be useful to have one piezoelectric layer with its C-axis (e.g., $C_N$) in one direction, and the second piezoelectric layer to have its crystalline orientation anti-parallel (e.g., $C_P$) to the C-axis of the first piezoelectric layer. Unfortunately, and as alluded to above, using known methods of fabricating piezoelectric layers, it is difficult to select the orientation of the piezoelectric crystal during fabrication, and especially on the same wafer.

In other applications, it may be useful to provide one piezoelectric layer with its C-axis (e.g., $C_p$, "piezoelectric (p) layer") in one direction, and the second piezoelectric layer to have its crystalline orientation anti-parallel (e.g., $C_N$, "inverse-piezoelectric (ip) layer) to the C-axis of the p-layer. Unfortunately, and as alluded to above, using certain known methods of fabricating piezoelectric layers, it is difficult to fabricate a p-layer and ip-layer, especially on the same wafer.

Generally, a bulk acoustic wave (BAW) resonator has a layer of rare-earth element doped piezoelectric material between two conductive plates (electrodes), which may be formed on a thin membrane. The rare-earth element doped piezoelectric material may be a thin layer of various materials, such as scandium-doped aluminum nitride (AlScN), for example. Thin layers made of AlScN are advantageous since they generally maintain piezoelectric properties at high temperatures (e.g., above 400° C.). However, AlScN has a lower piezoelectric coefficient $d_{33}$ than both ZnO and PZT, for example.

An AlScN thin layer may be deposited with various specific crystal structures, including a wurtzite structure with the normal to the film oriented along the (0001), which consists of a hexagonal crystal structure with alternating layers of aluminum (Al) and scandium (Sc), and nitrogen (N), and a zincblende structure, which consists of a symmetric structure of Al, Sc and N atoms, for example. Due to the nature of the Al—N and the Sc—N bonding in the wurtzite structure, electric field polarization is present in the AlScN crystal, resulting in the piezoelectric properties of the AlScN thin layer. To exploit this polarization and the corresponding piezoelectric effect, one must synthesize the AlScN with a specific crystal orientation. Generally, a higher electromechanical coupling coefficient ($kt^2$) is desirable, since the higher the electromechanical coupling coefficient, the less material is required to provide the same piezoelectric effect.

What is needed, therefore, is a method of fabricating rare-earth element doped piezoelectric materials that overcomes at least the known shortcomings described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
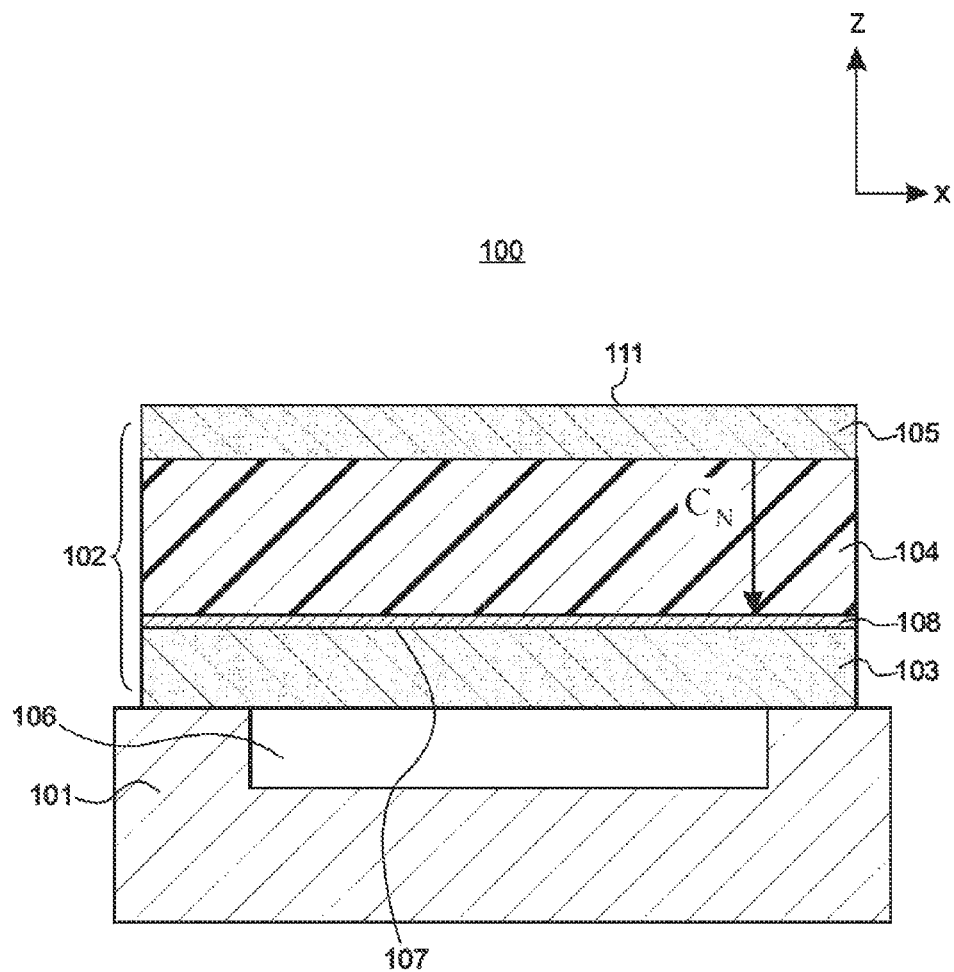
FIG. 1A shows a bulk acoustic wave (BAW) resonator fabricated in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree.

For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the illustrative embodiments. Such methods and apparati are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Certain aspects of the present teachings are relevant to components of FBAR devices, FBAR-based filters, their materials and their methods of fabrication. Many details of FBARs, materials thereof and their methods of fabrication may be found in one or more of the following U.S. patents and patent applications: U.S. Pat. No. 6,107,721, to Lakin; U.S. Pat. Nos. 5,587,620, 5,873,153 and 6,507,983 to Ruby, et al.; U.S. patent application Ser. No. 11/443,954, entitled "Piezoelectric Resonator Structures and Electrical Filters" to Richard C. Ruby, et al.; U.S. patent application Ser. No. 10/990,201, entitled "Thin Film Bulk Acoustic Resonator with Mass Loaded Perimeter" to Hongjun Feng, et al.; and U.S. patent application Ser. No. 11/713,726, entitled "Piezoelectric Resonator Structures and Electrical Filters having Frame Elements" to Jamneala, et al.; and U.S. patent application Ser. No. 11/159,753, entitled "Acoustic Resonator Performance Enhancement Using Alternating Frame Structure" to Richard C. Ruby, et al. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

Generally, the present teachings relate to a method of fabricating a piezoelectric layer comprising a selected C-axis orientation (i.e., polarity). In certain embodiments a rare-earth element doped piezoelectric material fabricated according to representative embodiments comprises a $C_N$ polarity (also referred to as type-$C_N$ rare-earth element doped piezoelectric material), whereas another rare-earth element doped piezoelectric material fabricated over the same substrate comprises a $C_P$ polarity (also referred to as type-$C_P$ rare-earth element doped piezoelectric material). In other embodiments, two or more piezoelectric layers are fabricated according to representative embodiments that comprise type $C_N$ polarity. Furthermore, in certain representative embodiments the rare-earth element doped piezoelectric material comprises AlScN, and the dopant material is scandium (Sc). It is emphasized that this is merely illustrative, and that the fabrication of other types of rare-earth element doped piezoelectric materials is contemplated.

Various embodiments relate to providing a thin layer of rare-earth element doped piezoelectric material (piezoelectric layer), such as AlScN, with an enhanced piezoelectric coefficient $d_{33}$ and an enhanced electromechanical coupling coefficient $kt^2$ by incorporating one or more rare-earth elements into the crystal lattice of a portion of the piezoelectric layer. By incorporating specific atomic percentages of the multiple rare-earth elements, the piezoelectric properties of the rare-earth element doped AlN, including piezoelectric coefficient $d_{33}$ and enhanced electromechanical effective coupling coefficient $kt^2$, are improved as compared to entirely stoichiometric (undoped) AlN. Also, presence of the undoped portion of the piezoelectric layer provides mechanical stability, preventing bowing.

In various embodiments, AlN material may be doped with scandium (Sc), for example, creating an AlScN compound with a predetermined atomic percentage of Sc. The Sc atom has an atomic radius that is larger than the atomic radius of the Al atom, resulting in a Sc—N bond length (2.25 Å) that is greater than the Al—N bond length (1.90 Å). This difference in bond lengths causes stress in the resulting AlScN material.

Applications of the illustrative methods will be appreciated by one having ordinary skill in the art. Some of these applications include FBARs useful in transformer applications and FBARs useful in filter applications. For example, the method of fabrication of rare-earth element doped piezoelectric materials comprising antiparallel C-axes (e.g., $C_N$ polarity and $C_P$ polarity) may be useful in the fabrication of film acoustic transformers, such as described in commonly owned U.S. Pat. Nos. 6,987,433 and 7,091,649, to Larson, III, et al. Moreover, the method of fabrication rare-earth element doped piezoelectric materials comprising antiparallel C-axes (e.g., $C_N$ polarity and $C_P$ polarity) or parallel C-axes (e.g., both $C_N$ polarity) may be useful in the fabrication of the stacked thin film bulk acoustic resonators (SBARs). SBARs comprise stacking two or more layers of rare-earth element doped piezoelectric material with electrodes between the piezoelectric layers and on the top and bottom of the stack. Such SBARs are described, for example in commonly owned U.S. Pat. Nos. 5,587,620 and 6,060,818, to Ruby, et al.

Furthermore, the method of fabricating rare-earth element doped piezoelectric materials comprising antiparallel C-axes (e.g., $C_N$ polarity and $C_P$ polarity) or both comprising $C_N$ polarity may be useful in CRF applications, such as described in commonly-owned U.S. patent application Ser. No. 12/201,641 entitled "Single Cavity Acoustic Resonators and Electrical Filters Comprising Single Cavity Acoustic Resonators" filed on Aug. 29, 2008 to Bradley, et al.; and in commonly owned U.S. Pat. No. 7,515,018 to Handtmann, et al. The disclosures of U.S. Pat. Nos. 5,587,620; 6,060,818; 6,987,433; 7,091,649 and 7,515,018; and the disclosure of U.S. patent application Ser. No. 12/201,641 are specifically incorporated herein by reference. It is emphasized that the noted applications are intended merely to illustrate applications of the methods of the present teachings, and that the application of the methods of fabricating rare-earth element doped piezoelectric materials of the present teachings are not limited to these illustrative applications.

FIG. 1A shows a simplified cross-sectional view of an FBAR 100 in accordance with a representative embodiment. An acoustic stack 102 is provided over a substrate 101 and comprises a first electrode 103 disposed over the substrate 101; a piezoelectric layer 104 disposed over the first electrode 103; and a second electrode 105 disposed over the piezoelectric layer 104. The piezoelectric layer 104 is a type-$C_N$ rare-earth element doped piezoelectric material, and is illustratively type-$C_N$ aluminum nitride (AlN). The substrate 101 illustratively comprises single-crystal silicon (Si).

In accordance with representative embodiments, the piezoelectric layer 104 is doped with a particular atomic percent of a rare-earth element. In certain embodiments, the doped piezoelectric material in the piezoelectric layer 104 comprises doped AlN, and a number of Al atoms within the AlN crystal lattice are replaced with a rare-earth element at a predetermined percentage, referred to as a "doping element." Because the doping elements replace only Al atoms (e.g., of an Al target), the percentage of nitrogen atoms in the piezoelectric material remains substantially the same regardless of the amount of doping. When percentages of doping elements are discussed herein, it is in reference to the total atoms (including nitrogen) of the AlN piezoelectric material, and is referred to herein as "atomic percentage." In accordance with certain representative embodiments, the atomic percentage of scandium in an aluminum nitride layer is approximately 0.5% to less than approximately 10.0%. More generally, the atomic percentage of scandium in an aluminum nitride layer is approximately 0.5% to approximately 44% in certain embodiments. In yet other representative embodiments, the atomic percentage of scandium in an aluminum nitride layer is approximately 2.5% to less than approximately 5.0%. So, for example, as described more fully below, if one of the Al targets used in the method of fabricating the piezoelectric layer 104 contains approximately 5 percent Sc, then the Al in the piezoelectric layer 104 has an atomic percentage of approximately 95.0%, while the Sc has an atomic percentage of approximately 5.0%. The atomic consistency of the piezoelectric layer 104 may then be represented as $Al_{0.9}Sc_{0.05}N$.

While many of the representative embodiments relate to scandium-doped AlN, it is noted that other rare-earth dopants are contemplated. Specifically, the other rare-earth elements include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare-earth elements, although specific examples are discussed herein.

A cavity 106 is formed in the substrate 101 beneath the first electrode 103 by a known method. The first electrode 103 and the second electrode 105 may be one of a variety of conductive materials, such as metals suitable as electrodes in BAW applications. Generally, materials suitable for the first electrode 103 and the second electrode 105 comprise Refractory metals, Transition metals or Noble Metals. In specific embodiments, the first and second electrodes 103, 105 illustratively comprise one or more of molybdenum (Mo), aluminum (Al), tungsten (W), platinum (Pt), ruthenium (Ru), niobium (Nb), hafnium (Hf) and uranium-238 (U-238), or other low-loss metals, and are fabricated using a known method. The piezoelectric layer 104 is fabricated in accordance with the present teachings.

In a representative embodiment, the FBAR 100 comprises a seed layer 108 disposed over an upper surface 107 of the first electrode 103. As described more fully below, the seed layer 108 is illustratively Al or Al—Sc and fosters growth of rare-earth element doped piezoelectric layer 104 of type-$C_N$ AlN. In a representative embodiment, the seed layer 108 has a thickness in the range of approximately 50 Å to approximately 1000 Å over the upper surface 107. In other representative embodiments described below, the seed layer 108 is not provided over the first electrode 103. Rather, the type-$C_N$ piezoelectric layer 104 is formed over the upper surface 107 of the first electrode 103 by methods of representative embodiments.

Figure 1B:
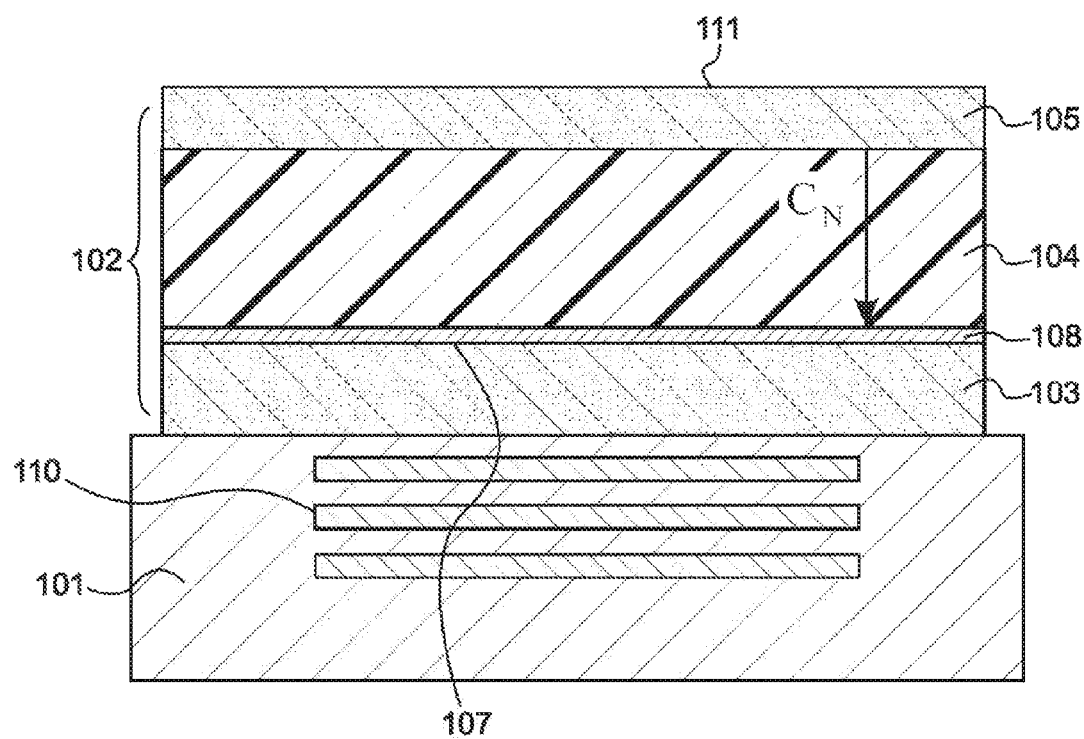
FIG. 1B shows a BAW resonator fabricated in accordance with a representative embodiment.

FIG. 1B shows a simplified cross-sectional view of BAW resonator 109 (alternatively referred to as FBAR 109 herein) in accordance with another representative embodiment. The acoustic stack 102 is provided over the substrate 101 and comprises the first electrode 103 disposed over the substrate 101; the piezoelectric layer 104 disposed over the first electrode 103; and the second electrode 105 disposed over the piezoelectric layer 104. The substrate 101 illustratively comprises single-crystal silicon (Si), and comprises an acoustic isolator 110 formed therein and disposed beneath the first electrode 103. The acoustic isolator 110 may be a known acoustic mirror comprising layers of alternating high acoustic impedance material and low impedance material. Notably, BAW resonators comprising an acoustic mirror comprising layers of alternating high acoustic impedance material and low impedance material are known as surface mounted acoustic resonators (SMRs). The piezoelectric layer 104 illustratively comprises AlN, and is a type-$C_N$ material fabricated in accordance with the present teachings.

In a representative embodiment, the BAW resonator 109 comprises the seed layer 108 disposed over an upper surface 107 of the first electrode 103. The seed layer 108 has a thickness in the range of approximately 50 Å to approximately 1000 Å over the upper surface 107. In other representative embodiments described below, the seed layer 108 is not provided over the first electrode 103. Rather, the type-$C_N$ piezoelectric layer 104 is formed over the upper surface 107 of the first electrode 103 by methods of representative embodiments.

Figure 2A:
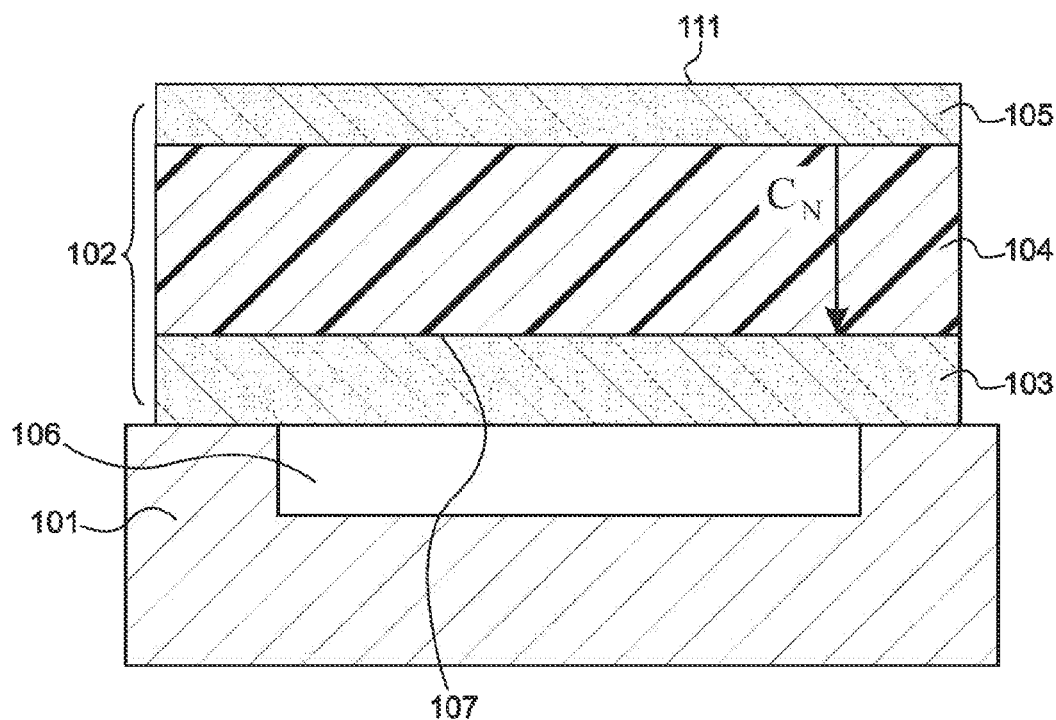
FIG. 2A shows a BAW resonator fabricated in accordance with a representative embodiment.

FIG. 2A shows a simplified cross-sectional view of an FBAR 200 in accordance with a representative embodiment. The acoustic stack 102 is provided over the substrate 101 and comprises the first electrode 103 disposed over the substrate 101; the piezoelectric layer 104 disposed over the first electrode 103; and the second electrode 105 disposed over the piezoelectric layer 104. The piezoelectric layer 104 is a type-$C_N$ rare-earth element doped piezoelectric material, and is illustratively type-$C_N$ aluminum nitride (AlN). The substrate 101 illustratively comprises single-crystal silicon (Si).

The cavity 106 is formed in the substrate 101 beneath the first electrode 103 by a known method. The first electrode 103 and the second electrode 105 may be one of a variety of conductive materials as noted above, and are fabricated using a known method. The piezoelectric layer 104 is fabricated in accordance with the present teachings.

In a representative embodiment, and unlike the FBAR 100, FBAR 200 does not comprise the seed layer 108 over the upper surface 107 of the first electrode 103. Rather, the type-$C_N$ piezoelectric layer 104 is formed over the upper surface 107 of the first electrode 103 by methods of representative embodiments described below.

Figure 2B:
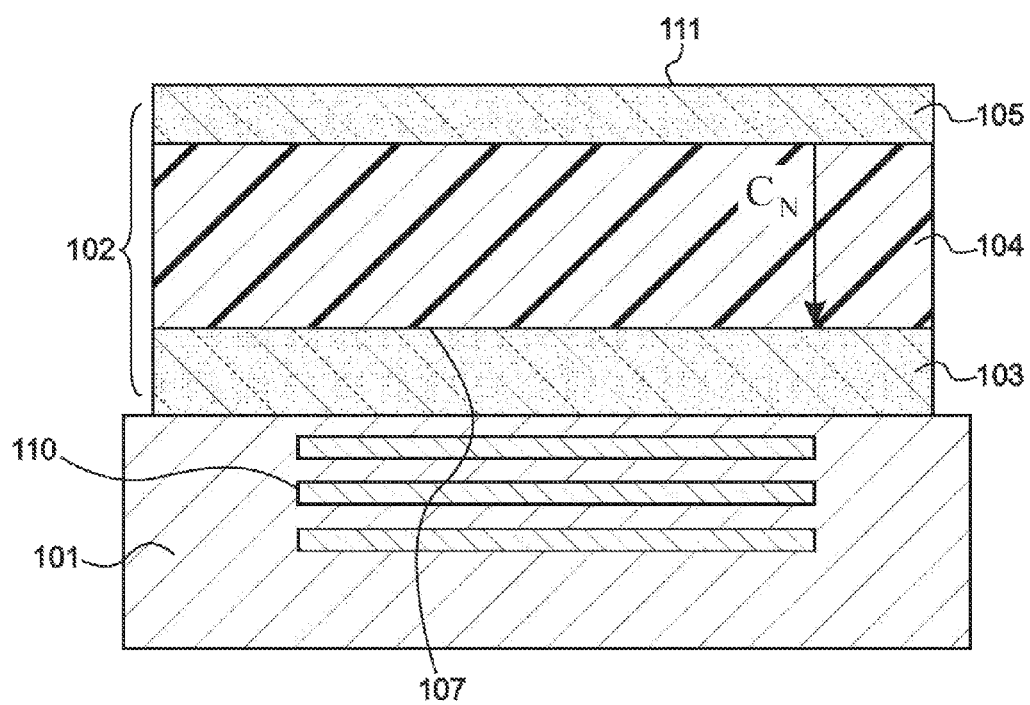
FIG. 2B shows a BAW resonator fabricated in accordance with a representative embodiment.

FIG. 2B shows a simplified cross-sectional view of a BAW resonator 201 (alternatively referred to as FBAR 201, herein) in accordance with a representative embodiment. The acoustic stack 102 is provided over the substrate 101 and comprises the first electrode 103 disposed over the substrate 101; the piezoelectric layer 104 disposed over the first electrode 103; and the second electrode 105 disposed over the piezoelectric layer 104. The substrate 101 illustratively comprises single-crystal silicon (Si), and comprises the acoustic isolator 110 formed therein and disposed beneath the first electrode 103. The acoustic isolator 110 may be a known acoustic mirror comprising layers of alternating high acoustic impedance material and low impedance material. The first electrode 103 and the second electrode 105 may be one of a variety of conductive materials as noted above, and are fabricated using a known method. The piezoelectric layer 104 is fabricated in accordance with the present teachings.

In a representative embodiment, and unlike FBAR 109 shown in FIG. 1B, the FBAR 201 does not comprise the seed layer 108 over the first electrode 103. Rather, the type-$C_N$ piezoelectric layer 104 is formed over the upper surface 107 of the first electrode 103 by methods of representative embodiments described below.

Figure 3A:
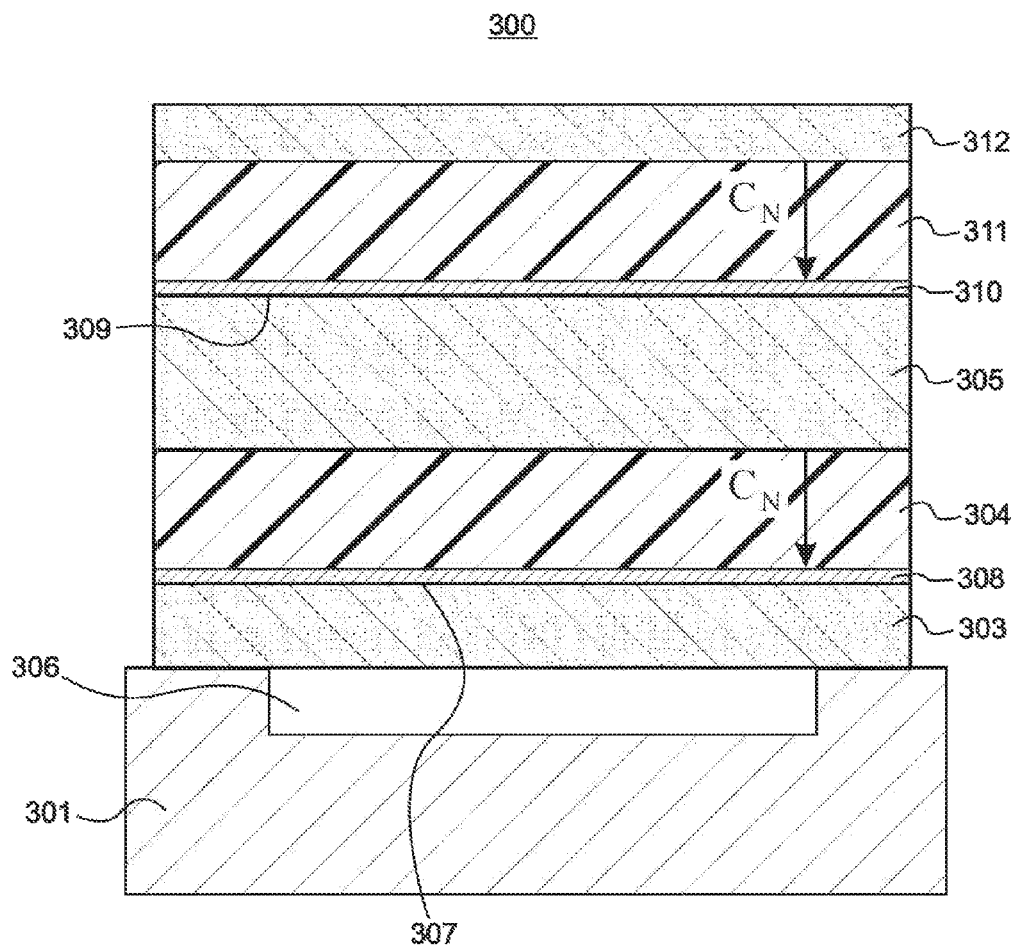
FIG. 3A shows a stacked film bulk acoustic wave resonator (SBAR) fabricated in accordance with a representative embodiment.

FIG. 3A shows a simplified cross-sectional view of as SBAR 300 in accordance with a representative embodiment. The SBAR 300 comprises a single cavity such as described in commonly-owned U.S. patent application Ser. No. 12/201,641 to Bradley, et al. The SBAR 300 comprises a first electrode 303 disposed over a substrate 301; a first piezoelectric layer 304 disposed over the first electrode 303; and a second electrode 305 disposed over the first piezoelectric layer 304. In the representative embodiment, the first piezoelectric layer 304 is a type-$C_N$ rare-earth element doped piezoelectric material, and is illustratively type-$C_N$ aluminum nitride (AlN). The substrate 301 illustratively comprises single-crystal silicon (Si).

A second piezoelectric layer 311 is disposed over the second electrode 305; and a third electrode 312 is disposed over the second piezoelectric layer 311. The second piezoelectric layer 311 is a type-$C_N$ rare-earth element doped piezoelectric material, and is illustratively type-$C_N$ aluminum nitride (AlN). A cavity 306 is formed in the substrate 301 beneath the first electrode 303 by a known method. The cavity 306 provides acoustic isolation as described above. Alternatively, an acoustic isolator (not shown in FIG. 3A) such as described above and comprising alternating layers of comparatively high and low acoustic impedance may be used instead of the cavity 306.

The first electrode 303, the second electrode 305 and the third electrode 312 may be one of a variety of conductive materials, such as metals suitable as electrodes in BAW applications. Generally, materials suitable for the first electrode 103 and the second electrode 105 comprise Refractory metals, Transition metals or Noble Metals. In specific embodiments, the first and second electrodes 103, 105 illustratively comprise one or more of molybdenum (Mo), aluminum (Al), tungsten (W), platinum (Pt), ruthenium (Ru), niobium (Nb), hafnium (Hf) and uranium-238 (U-238), or other low-loss metals, and are fabricated using a known method. The piezoelectric layer 104 is fabricated in accordance with the present teachings.

In a representative embodiment, the SBAR 300 comprises a first seed layer 308 disposed over an upper surface 307 of the first electrode 303; and a second seed layer 310 disposed over an upper surface 309 of the second electrode 305. As described more fully below, the first and second seed layers 308, 310 are illustratively Al and foster growth of the first and second piezoelectric layers 304, 311 both of type-$C_N$ AlN. In a representative embodiment, the first and second seed layers 308, 310 each have a thickness in the range of approximately 50 Å to approximately 1000 Å.

It is appreciated that the SBAR 300 of the representative embodiment comprises an acoustic stack comprising more than one type $C_N$ piezoelectric layer. It is emphasized that other BAW resonator structures comprising an acoustic stack comprising more than one type $C_N$ piezoelectric layer are contemplated. For example, decoupled stacked acoustic resonators comprising more than one FBAR with an acoustic decoupler disposed therebetween are contemplated. In such an embodiment, each of the FBARs would include a type $C_N$ piezoelectric layer fabricated in accordance with the present teachings. The present teachings contemplate forming the piezoelectric layers with $C_N$ axes by providing a seed layer over a surface of respective electrodes and forming the respective piezoelectric layer thereover.

Furthermore, in certain BAW structures comprising an acoustic resonator comprising more than one piezoelectric layer, it is desirable to provide piezoelectric layers comprising anti-parallel C-axes (e.g., one type $C_N$ piezoelectric layer, and one type $C_P$ piezoelectric layer). The present teachings also contemplate forming the piezoelectric layers with $C_N$ axes by providing a seed layer over the surface of an electrode, forming the type $C_N$ piezoelectric layer over the seed layer and forming a type $C_P$ piezoelectric layer over another electrode. The type $C_P$ piezoelectric layer is formed using a known method.

Figure 3B:
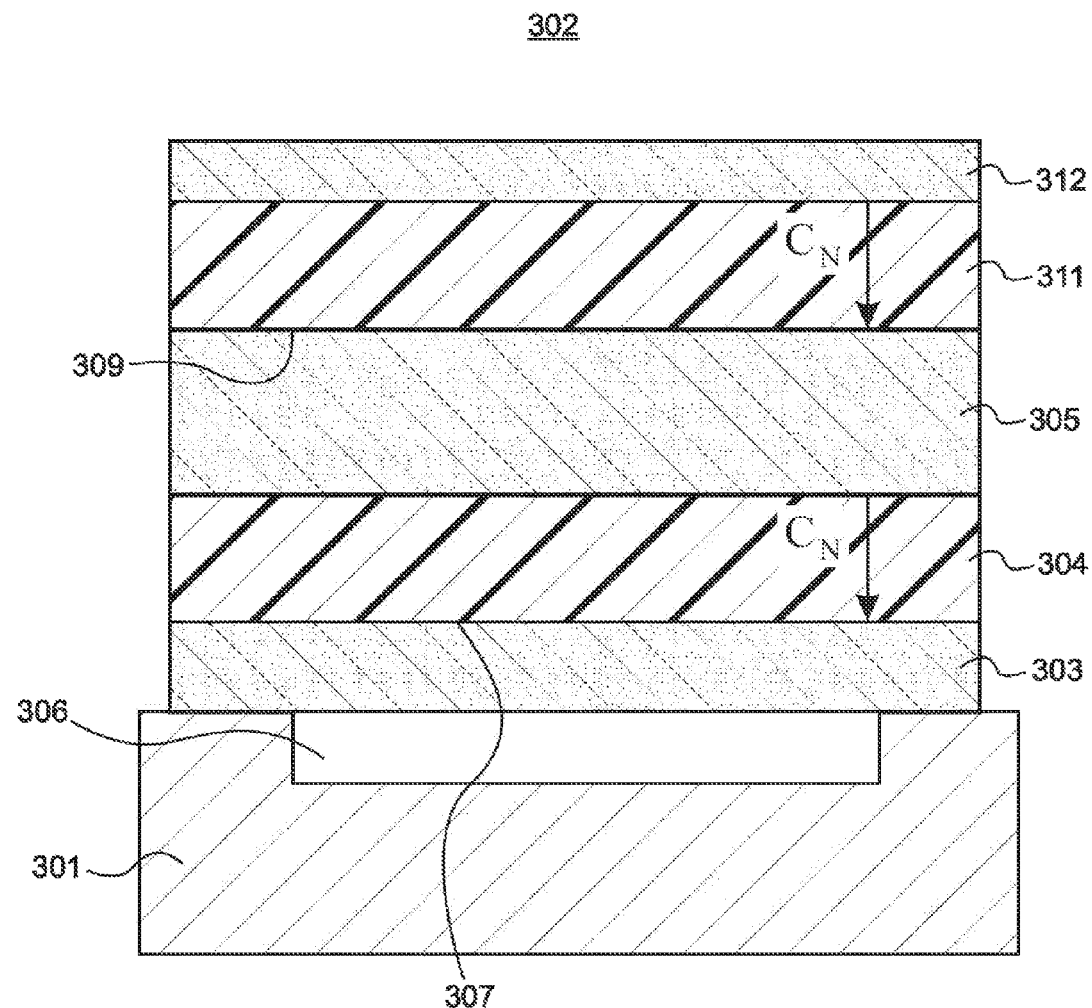
FIG. 3B shows an SBAR fabricated in accordance with a representative embodiment.

FIG. 3B shows a simplified cross-sectional view of a SBAR 302 in accordance with a representative embodiment. The SBAR 302 comprises a single cavity such as described in commonly-owned U.S. patent application Ser. No. 12/201,641 to Bradley, et al. The SBAR 302 comprises first electrode 303 disposed over substrate 301; first piezoelectric layer 304 disposed over the first electrode 303; and second electrode 305 disposed over the first piezoelectric layer 304. In a representative embodiment, the first piezoelectric layer 304 is a type-$C_N$ rare-earth element doped piezoelectric material, and is illustratively type-$C_N$ aluminum nitride (AlN). The substrate 301 illustratively comprises single-crystal silicon (Si).

The second piezoelectric layer 311 is disposed over the second electrode 305; and the third electrode 312 is disposed over the second piezoelectric layer 311. The second piezoelectric layer 311 is a type-$C_N$ rare-earth element doped piezoelectric material, and is illustratively type-$C_N$ aluminum nitride (AlN). Cavity 306 is formed in the substrate 301 beneath the first electrode 303 by a known method. The cavity 306 provides acoustic isolation as described above. Alternatively, an acoustic isolator (not shown in FIG. 3B) such as described above and comprising alternating layers of comparatively high and low acoustic impedance may be used instead of the cavity 306.

The first electrode 303, the second electrode 305 and the third electrode 312 may be one of a variety of conductive materials, such as metals suitable as electrodes in BAW applications. Generally, materials suitable for the first electrode 103 and the second electrode 105 comprise Refractory metals, Transition metals or Noble Metals. In specific embodiments, the first and second electrodes 103, 105 illustratively comprise one or more of molybdenum (Mo), aluminum (Al), tungsten (W), platinum (Pt), ruthenium (Ru), niobium (Nb), hafnium (Hf) and uranium-238

(U-238), or other low-loss metals, and are fabricated using a known method. The piezoelectric layer 104 is fabricated in accordance with the present teachings.

In a representative embodiment, and unlike SBAR 300 shown in FIG. 3A, the SBAR 302 does not comprise either the first seed layer 308 over an upper surface 307 of the first electrode 303, or the second seed layer 310 disposed over an upper surface 309 of the second electrode 305. Rather, (the type-$C_N$) first and second piezoelectric layers 304, 311 are formed over upper surface 307 and 309 of the first electrode 303 and the second electrode 305, respectively, by methods of representative embodiments described below.

It is appreciated that the SBAR 302 of the representative embodiment comprises an acoustic stack comprising more than one piezoelectric layer having a $C_N$ axis. It is emphasized that other BAW resonator structures comprising an acoustic stack comprising more than one type $C_N$ piezoelectric layer are contemplated. For example, decoupled stacked acoustic resonators comprising more than one FBAR with an acoustic decoupler disposed there between are contemplated. In such an embodiment, each of the FBARs would include a type $C_N$ piezoelectric layer fabricated in accordance with the present teachings. The present teachings contemplate forming the type $C_N$ piezoelectric layers over a surface of respective electrodes. Furthermore, in certain BAW structures comprising an acoustic resonator comprising more than one piezoelectric layer, it is desirable to provide piezoelectric layers comprising anti-parallel C-axes (e.g., one type $C_N$ piezoelectric layer, and one type $C_P$ piezoelectric layer). The present teachings also contemplate forming the piezoelectric layers with $C_N$ axes and forming a type $C_P$ piezoelectric layer over another electrode. The type $C_P$ piezoelectric layer is formed using a known method.

Figure 4:
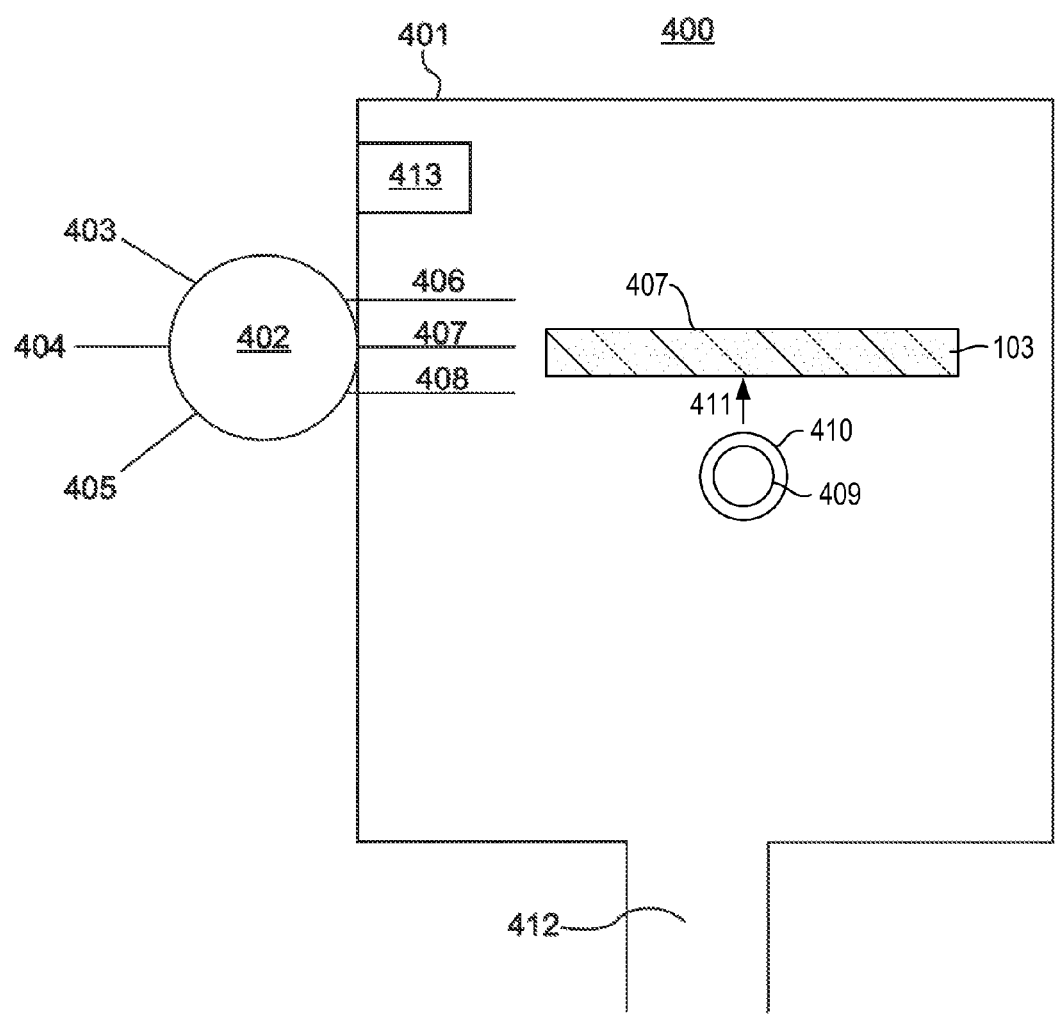
FIG. 4 shows a simplified schematic diagram of a deposition system in accordance with a representative embodiment.

FIG. 4 shows a simplified schematic diagram of a deposition system 400 in accordance with a representative embodiment. The deposition system 400 comprises components commercially available from Advanced Modular Systems, Inc. of Santa Barbara, Calif. USA, for example. In representative embodiments, the deposition system 400 is a sputter deposition system, many of the components and dynamics of which are known to one of ordinary skill in the art. Because many details of the deposition system 400 and sputtering techniques are known, many details are not provided to avoid obscuring the description of the representative embodiments.

The deposition system 400 comprises a reaction chamber 401, which is maintained substantially at vacuum during fabrication of rare-earth element doped piezoelectric materials of the representative embodiments. The deposition system 400 also comprises gas inlets 403, 404, 405 as inputs to a flow control system 402, which controls the flow of selected gases provided to the gas inlets 403, 404, 405 and the flow rates of the gases provided. A load and lock chamber 413 is provided to allow for the loading of wafers and then transferring them to a reaction chamber 401 without breaking vacuum. The flow control system 402 comprises valves (not shown) for selecting the gases to be flowed into the reaction chamber 401, flow controllers (not shown) to measure and control the flow rates thereof, and a controller (not shown) comprising suitable software for controlling the valves. Moreover, the deposition system 400 may comprise an exhaust outlet 412, which has a constant pumping speed, and control of the total pressure in the reaction chamber 401 is provided by the changing of gas flow by each flow controller independently or together.

The flow control system 402 may comprise an interface (not shown), such as a graphic user interface (not shown).

The deposition system 400 also comprises gas outlets 406, 407, 408, from the flow control system 402. Gas from the gas outlets 406, 407, 408 is provided to the reaction chamber 401. Notably, the use of mixed gases (e.g., Ar and $H_2$) from a single source is also contemplated. As described more fully below, these gases form atmospheres used in cleaning and sputter depositing materials 411 from first target 409 and second target 410 over the substrate 101 according to representative embodiments.

In forming a rare-earth element doped piezoelectric material for the piezoelectric layer 104, a combined aluminum and scandium target may be used. Notably, therefore, in one representative embodiment, both the first and second targets 409, 410 are alloys of aluminum and scandium having selected percentages of aluminum and scandium to achieve a desired atomic percentage scandium doping in the doped piezoelectric material of piezoelectric layer 104. In accordance with a representative embodiment, the first and second targets 409, 410 are arranged concentrically and are spaced apart. AC power is selectively applied to sputter a seed layer 108 comprising a metal (e.g., Al—Sc seed layer) over the upper surface 107 of the first electrode 10. During the forming of the seed layer 108, Ar is flowed to one of the gas inlets 403, 404, 405 and from one of the gas outlets 406, 407; and no other gases are flowed from the other gas outlet 406, 407. As a result, in the presently described representative embodiments to form Sc-doped AlN, Ar plasma created in the reaction chamber 401 results in the sputter deposition of a substantially Al—Sc seed layer 108 from the first and second targets 409, 410 over the upper surface 107 of the first electrode 103. Notably, the longer AC power is applied to the first and second targets, the thicker the seed layer 108 that is formed.

In the presently described embodiment, where both the first and second targets 409, 410 are an alloy of aluminum and scandium, the proportions of Al and Sc in the target are selected to provide a scandium-doped aluminum nitride piezoelectric layer having an atomic percentage selected to achieve a desired atomic percentage doping in the doped piezoelectric material of piezoelectric layer 104. In certain representative embodiments where the first and second targets 409, 410 are arranged concentrically, it is observed that the scandium from the inner concentric target (e.g., first target 409) is sputtered in a cone-like fashion from the inner target. This results in an uneven deposition of scandium over the upper surface 107 of the first electrode 103, with an increasing atomic percentage of scandium being sputtered towards the outer edges (e.g., greater atomic percentage with increasing radius of sputtered material over the upper surface 107). As such, given the sputtering pattern realized by this illustrative method, in order to more evenly distribute the sputtered scandium, the outer concentric target (e.g., second target 410) comprises an alloy of Al—Sc with a smaller atomic percentage of scandium than that of the inner concentric target (e.g., first target 409). So, by way of illustrative example, if an atomic percentage of 9.0% scandium is desired in the doped piezoelectric material of piezoelectric layer 104, the inner concentric target (e.g., first target 409) comprises an Al—Sc alloy having an atomic percentage of scandium of approximately 9%, whereas the outer concentric target (e.g., second target 410) comprises an Al—Sc alloy having an atomic percentage of scandium of approximately 4% to approximately 5%. This will provide a doped piezoelectric material in the piezoelectric layer 104 having an atomic consistency of $Al_{0.91}Sc_{0.09}N$. Again, this is merely an illustrative dopant and an illustrative atomic percentage of dopant in the piezoelectric layer. More generally, the atomic percentage of rare-earth element (e.g., Sc) in the inner target (e.g., first target 409) is approximately equal to the desired resultant atomic percentage of dopant in the result piezoelectric material and the outer target (e.g., second target 419) is normally approximately 3 atomic percent to approximately 5 atomic percent less rare-earth element than the atomic percentage of rare-earth element in the inner target.

In accordance with another representative embodiment, one of the first and second targets 409, 410, comprises an alloy aluminum and scandium and the other target comprises only aluminum. In this embodiment, the target comprising the alloy has selected percentages of aluminum and scandium to achieve a desired atomic percentage scandium doping in the doped piezoelectric material of piezoelectric layer 104. In accordance with a representative embodiment, the first and second targets are arranged concentrically and are spaced apart. AC power is selectively applied to the all aluminum target, whereas the alloy target is initially grounded or has no voltage supplied relative to ground. The application of AC power to the all aluminum target sputters a seed layer 108 comprising Al over the upper surface 107 of the first electrode 103. During the forming of the seed layer 108, Ar is flowed to one of the gas inlets 403, 404, 405 and from one of the gas outlets 406, 407; and no other gases are flowed from the other gas outlet 406, 407. As a result, in the presently described representative embodiments to form Sc-doped AlN, Ar plasma created in the reaction chamber 401 results in the sputter deposition of a substantially Al seed layer 108 from the first or second target 409, 410 comprising only aluminum over the upper surface 107 of the first electrode 103. Notably, the longer AC power is applied to the all aluminum target, the thicker the seed layer 108 that is formed.

In the presently described embodiment, where one of the first and second targets 409, 410 are an alloy of aluminum and scandium, the proportions of Al and Sc in the alloy target are selected to provide a scandium-doped aluminum nitride piezoelectric layer having an atomic percentage selected to achieve a desired atomic percentage doping in the doped piezoelectric material of piezoelectric layer 104. So, by way of illustrative example, if an atomic percentage of 5.0% scandium is desired in the doped piezoelectric material of piezoelectric layer 104, the inner concentric target (e.g., first target 409) comprises an Al—Sc alloy having an atomic percentage of scandium of approximately 5%. This will provide a doped piezoelectric material in the piezoelectric layer 104 having an atomic consistency of $Al_{0.95}Sc_{0.05}N$. Again, this is merely an illustrative dopant and an illustrative atomic percentage of dopant in the piezoelectric layer.

The basic principle of providing one or both of the first and second targets 409, 410 having an alloy of a desired rare-earth element at a desired atomic percentage can be applied to other rare-earth elements having other desired atomic percentages of the desired dopant. Notably, in accordance with certain representative embodiments, the dopant is scandium and the doped piezoelectric material of piezoelectric layer 104 is aluminum nitride where the atomic percentage of scandium in an aluminum nitride layer (piezoelectric layer 104) is approximately 0.5% to less than approximately 10.0%. As such, fabricating such a doped piezoelectric layer comprises providing one or both of the first and second targets 409, 410 comprising an alloy of Al—Sc where the atomic percentage of scandium in first and/or second target 409, 410 is selected to provide an atomic percentage of scandium doping in an aluminum nitride layer of approximately 0.5% to less than approximately 10.0%. More generally, the atomic percentage of scandium in an aluminum nitride layer is approximately 0.5% to approximately 40% in certain embodiments. In yet other representative embodiments, the atomic percentage of scandium in an aluminum nitride layer is approximately 2.5% to less than approximately 5.0%.

As described in connection with representative embodiments below, the gas inlets 403, 404, 405 may selectively provide argon (Ar), nitrogen (N) or hydrogen (H), respectively, or a combination thereof. The gas outlets 406, 407, 408 provide a mixture of these gases as to the reaction chamber 401. For example, in forming an Al—Sc seed layer (e.g., seed layer 108), Ar plasma may be formed by the outlet of Ar gas from one of the gas outlets 406, 407 in the reaction chamber 401, and results in sputter deposition of seed layer 108 of Al—Sc from the first and second targets 409, 410 that comprise Al—Sc over the first electrode 103. After the forming of the seed layer 108, the growth of type-$C_N$ piezoelectric layer (e.g., piezoelectric layer 104) is provided by selectively sputtering the first and second targets 409, 410 in an $Ar/N_2$ atmosphere, from gas outlets 406, 407.

Alternatively, in forming an Al seed layer (e.g., seed layer 108), Ar plasma may be formed by the outlet of Ar gas from one of the gas outlets 406, 407 in the reaction chamber 401, and results in sputter deposition of seed layer 108 of Al from one of the first and second Al targets 409, 410 that comprises only aluminum over the first electrode 103. After the forming of the seed layer 108, the growth of a type-$C_N$ piezoelectric layer (e.g., piezoelectric layer 104) is provided by selectively sputtering the first and second targets 409,410 in an $Ar/N_2$ atmosphere, from gas outlets 406, 407.

In another exemplary method where no seed layer is provided, hydrogen ($H_2$) is provided from one of the gas outlets 406, 407 to provide a hydrogen atmosphere useful in removing contaminants on the upper surface 107. The contaminants could include metal oxides, gases such as $H_2O$, $N_2$ or $O_2$ on the upper surface 107, as well as processing residues such as photoresist. After the cleaning step in the hydrogen atmosphere, the growth of type-$C_N$ piezoelectric layer (e.g., piezoelectric layer 104) is provided by selectively sputtering the first and second targets 409, 410 (e.g., Al) in an $Ar/N_2/H_2$ atmosphere, from gas outlets 406, 407, 408 or by a pre-mixed source of Ar/H2, and a nitrogen source.

Figure 5:
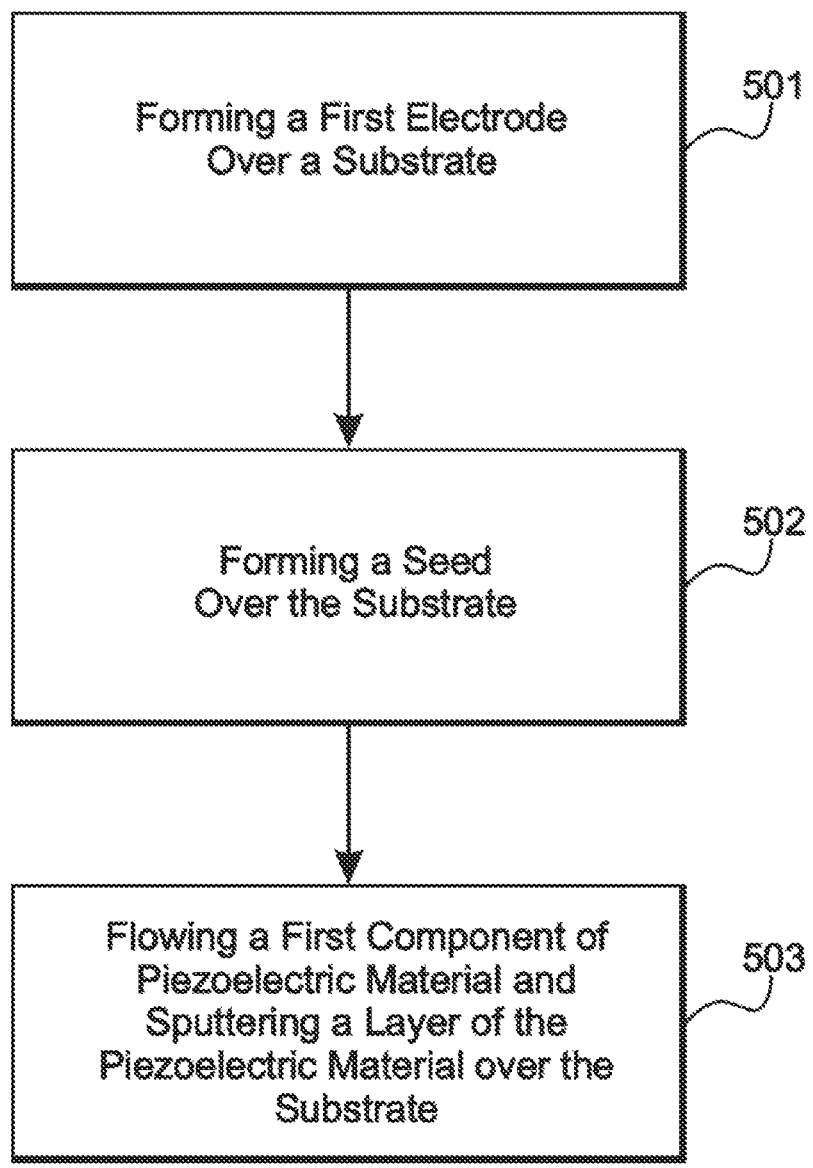
FIG. 5 shows a flow-chart of a method of fabricating a piezoelectric layer in accordance with a first representative embodiment.

Turning to FIG. 5, a method 500 of fabricating a piezoelectric layer in accordance with a representative embodiment is shown in a simplified flow-chart. The method 500 is described with direct reference to the components of FIGS. 1A, 1B and the deposition system 400 of FIG. 4 for illustrative purposes. Fabrication of other FBAR structures, such as SBAR 300, using the method 500, is also contemplated. As will become clearer as the present description continues, the method 500 provides a seed layer 108 over the first electrode 103 in the formation of type-$C_N$ piezoelectric layer 104. As alluded to above, the method 500 may be used to provide the first seed layer 308 over the first electrode 303 and the second seed layer 310 over the second electrode 305 of the SBAR 300 by repeating the process after forming the intervening layer(s) of the SBAR 300.

At 501, the method comprises forming a first electrode over a substrate. Illustratively, the first electrode 103 is formed over the substrate 101. For purposes of description of the method 500, the first electrode 103 is formed by sputter-depositing the selected conductive material over the substrate 101 by a known method, although other methods of forming the first electrode are contemplated. Notably, the formation of the cavity 106 in the substrate 101 may be carried out before fabrication of the acoustic stack 102 of the FBAR 100, with the cavity 106 filled with a sacrificial material (not shown) such as phosphosilicate glass (PSG) or other release processes such as polysilicon and xenon difluoride etchant, known to one of ordinary skill in the art, during the fabrication of layers of the acoustic stack 102; and released after the forming of the layers of the acoustic stack 102. Alternatively, the acoustic isolator 110 is formed in the substrate 101 before forming of the first electrode 103 of the FBAR 109.

The fabrication of the piezoelectric layer 104 begins with cleaning the upper surface 107 of the first electrode 103 before the forming of the piezoelectric layer 104. In a representative embodiment, this cleaning step comprises flowing only Ar to one of the gas inlets 403, 404, 405 and to one of the gas outlets 406, 407 to provide an Ar atmosphere in the reaction chamber 401. An RF bias is applied to the first electrode 103 and the reaction chamber 401 is maintained at ground, so that the first electrode 103 functions as a cathode. An Ar plasma is formed in the reaction chamber 401 and bombards the upper surface 107 of the first electrode 103. Illustratively, the RF power is provided in the range of approximately 15 W to approximately 1 kW, and the Ar bombardment of the upper surface 107 of the first electrode is maintained for a few seconds to a few minutes to ensure proper removal of contaminants. Notably, during this cleaning step, no voltage is applied to the first and second targets 409, 410.

It is believed that the comparatively high kinetic energy of the Ar ions provides suitable bombardment of the upper surface 107 to remove substantially therefrom contaminants such as adsorbed water, adsorbed oxide, adsorbed nitrides and native oxides formed on materials commonly used in the fabrication of the first electrode 103. By substantially removing contaminants from the upper surface 107, the formation of a comparatively pure and electropositive seed layer 108 (comprising Al or AlSc) is fostered. Thereafter, a type-$C_N$ AlN piezoelectric layer may be formed by deposition of AlN over the seed layer 108 as described above. Furthermore, in an embodiment where the first electrode 103 comprises Pt, by this cleaning step in the Ar atmosphere, it is believed that contaminants such as adsorbed water, adsorbed oxides and adsorbed nitrides are removed from the Pt, which does not readily form native oxides.

At 502, the method 500 comprises forming the seed layer 108 over the upper surface 107 of the first electrode 103. In a representative embodiment, at this point the RF power to the first electrode 103 is terminated, and AC power is applied. In an embodiment where both the first and second targets 409, 410 comprise an Al—Sc alloy, the AC power is applied between the first and second targets 409, 410 and an Al—Sc (all metal) seed layer is formed.

Illustratively, in the presently described embodiment, AlN is the rare-earth element doped piezoelectric material, and first and second targets 409, 410 comprise an Al—Sc alloy. Al—Sc is sputtered selectively from the first and second targets 409, 410 during the negative potential half-cycle of AC power applied to the selected one of the first and second targets 409, 410. This provides seed layer 108 over the upper surface 107 of the first electrode 103. During the forming of the seed layer 108, Ar is flowed to one of the gas inlets 403, 404, 405 and from one of the gas outlets 406, 407; and no other gases are flowed from the other gas outlet 406, 407. As a result, Ar plasma created in the reaction chamber 401 results in the sputter deposition of an Al—Sc seed layer from the first or second target 409, 410 and over the upper surface 107 of the first electrode 103. Notably, the longer AC power is applied between the first and second targets, the thicker the Al—Sc seed layer 108 that is formed.

In another embodiment one of the first and second targets 409, 410 is pure aluminum, and AC power is applied to the all-aluminum target and the Al—Sc alloy target is initially grounded or has no voltage supplied relative to ground. This results in sputtering of a purely Al seed layer from the first or second targets 409, 410 comprising pure aluminum Illustratively, AlN is the rare-earth element doped piezoelectric material, and one of the first and second targets 409, 410 comprise an Al—Sc alloy, whereas the other of the first and second targets comprises Al. Aluminum is sputtered from the one first and second targets 409, 410 having only Al during the negative potential half-cycle of AC power applied to the selected one of the first and second targets 409, 410 having only Al and provides seed layer 108 over the upper surface 107 of the first electrode 103. During the forming of the seed layer 108, Ar is flowed to one of the gas inlets 403, 404, 405 and from one of the gas outlets 406, 407; and no other gases are flowed from the other gas outlet 406, 407. As a result, Ar plasma created in the reaction chamber 401 results in the sputter deposition of a substantially pure aluminum seed layer from the first or second target 409, 410 comprising only aluminum and over the upper surface 107 of the first electrode 103. Notably, the longer AC power is applied to the pure aluminum target (i.e., the first or second targets 409, 410 that is all aluminum), the thicker the seed layer 108 that is formed.

At 503, and after the seed layer 108 is formed, the method 500 comprises flowing a first component of the piezoelectric layer and sputtering the piezoelectric layer 104 over the substrate 101. In a representative embodiment used to form AlN doped with a rare-earth element, the first component comprises nitrogen ($N_2$) gas. The flowing of nitrogen into the reaction chamber 401 comprises providing nitrogen to one of the gas inlets 403, 404, 405 and from one of the gas outlets 406, 407, 408, while continuing the flow of Ar to another of the gas inlets 403, 404, 405 and from the other of the gas outlets 406, 407, 408. During the flowing of nitrogen, AC power is supplied between the first and second target 409, 410, and the rare-earth element doped piezoelectric material is formed over the surface to the first or second target 409, 410, which comprises an alloy of the rare-earth element and the second component of the piezoelectric layer 104. In a representative embodiment, the AC power has a frequency in the range of approximately 20 kHz to approximately 100 kHz, and power in the range of approximately 1 kW to approximately 7 kW. Illustratively, the AC power is 7 kW and has a frequency of 40 kHz.

The Ar/$N_2$ plasma is maintained, and is believed to sputter the rare-earth element doped piezoelectric material (e.g., AlScN) from the first and/or second targets 409, 410 to the seed layer 108 in a preferred orientation to provide type $C_N$ AlN over the seed layer 108. Beneficially, the depositing of the piezoelectric layer 104 in the portion of the method is effected without breaking vacuum conditions in the deposition system 400, and comparatively rapidly after completion of the forming of the seed layer 108. Maintaining vacuum and relatively rapidly beginning the deposition of the piezoelectric layer 104 is believed to substantially prevent adsorption of oxides and nitrides or the formation of other contaminants over the exposed surface(s) of the seed layer 108.

It is believed that because the Al seed layer 108 is comparatively free from contaminants due to the cleaning step in Ar, a substantially electropositive surface of Al is formed over the upper surface 107 of the first electrode 103.

The Al seed layer 108 is comparatively highly reactive, and attracts nitrogen of the sputtered rare-earth element doped piezoelectric material (e.g., AlScN). As such, in the present example, it is believed that AlScN is oriented with the nitrogen bonded to the electropositive seed layer of aluminum, and the aluminum of the AlScN not being bonded is exposed (i.e., in a structure: seed layer-NAl). Sputtered AlN is then bonded to the exposed aluminum, with the nitrogen bonded to the exposed aluminum (i.e., in a structure: seed layer-N-AL-N-AL with substituted Sc per the desired stoichiometry). This sequence results in the forming of the crystal structure of type-$C_N$ AlScN rare-earth element doped piezoelectric material, and continues until a suitable thickness of the type-$C_N$ AlScN (e.g., piezoelectric layer 104) is realized. In one embodiment, the AlScN layer has a thickness of approximately 12,000 Å.

The flow rates of Ar and $N_2$ are set to control the stress of the resultant AlScN. Notably, a higher flow rate of Ar results in tensile stress in the AlScN; a lower flow rate of Ar results in compressive stress in the AlScN. Similarly, a higher flow rate of $N_2$ results in tensile stress in the AlScN; and a lower flow rate of $N_2$ results in compressive stress in the AlScN. In representative embodiments, the flow rate of Ar is in the range of approximately 6 sccm to approximately 25 sccm, and the flow rate of $N_2$ is in the range of approximately 39 sccm to approximately 50 sccm. Notably, the flow rates are merely illustrative. More generally, the flow rates are adjusted according to the volume of the deposition chamber, the speed of the pumps and other parameters as would be appreciated by one of ordinary skill in the art.

After the piezoelectric layer 104 is formed, the second electrode 105 is formed over the piezoelectric layer 104. The second electrode 105 comprises a metal that is sputter-deposited over the piezoelectric layer 104 by a known method. Illustratively, the second electrode 105 comprises the same material as the first electrode 103. Notably, different materials may be used for the electrodes as may be beneficial to the FBAR (BAW resonator) 100.

After the forming of the second electrode 105, the release of the sacrificial material to form the cavity 106 is carried out using a suitable etchant such as HF. As should be appreciated, if unprotected the seed layer 108 may be etched by the etchant as well. In order to prevent this from significantly deteriorating the seed layer 108, a protective layer (not shown) is provided over and/or around the acoustic stack 102 comprising the first electrode 103, the seed layer 108, the piezoelectric layer 104 and the second electrode 105. The protective layer may comprise a metal 'dam' formed from the same metal as the first and second electrodes 103, 105, for example, or may be formed of a material impervious to the etchant (e.g., HF). Such protective layers are formed by known deposition, lithography and etching sequences. Alternatively, a comparatively thin (e.g., 50 Å) seed layer 108 may be provided. It is believed that a comparatively thin seed layer will not be appreciably etched by the etchant used to release the sacrificial material from the cavity 106. Of course, if instead of the cavity 106, the acoustic isolator 110 is implemented as in FBAR 109, the release of sacrificial material and thus the passivation material would not be necessary.

The FBAR 100 and BAW resonator 109 described in connection with the method 500 comprise a single piezoelectric layer. As noted above, the acoustic stack of certain resonator structures comprises more than one piezoelectric layer. It is emphasized that the method 500 can be repeated to form a second type-$C_N$ AlScN piezoelectric layer. For example, by repeating the method 500, SBAR 300 comprising first and second piezoelectric layers 304, 311 is fabricated by forming first and second seed layers 308, 310 respectively over respective upper surfaces 307, 309 of first and second electrodes 303, 305.

In certain applications, two or more piezoelectric layers may be included in the acoustic stack, and have opposing C-axes. For example, in an acoustic stack described in U.S. Pat. No. 7,515,018, the C-axes of the piezoelectric layers may be antiparallel. As can be appreciated, in a structure comprising two piezoelectric layers in an acoustic stack, the first piezoelectric may be type-$C_N$ rare-earth element doped piezoelectric material (e.g., first piezoelectric layer 304), and the second piezoelectric layer 311 may be type-$C_P$ rare-earth element doped piezoelectric material. In such an embodiment, the deposition system 400 and method 500 could be used to form the type-$C_N$ piezoelectric layer by method 500, and the type-$C_P$ piezoelectric layer would be formed by a known method using deposition system 400. For example, the first electrode 103 may be formed as described in 501 above; and the $C_P$ piezoelectric layer may be formed by flowing the first component of the rare-earth element doped piezoelectric material as described in 503 above. Notably, in forming a $C_P$ piezoelectric layer, the sequence of 502 is not performed.

Figure 6:
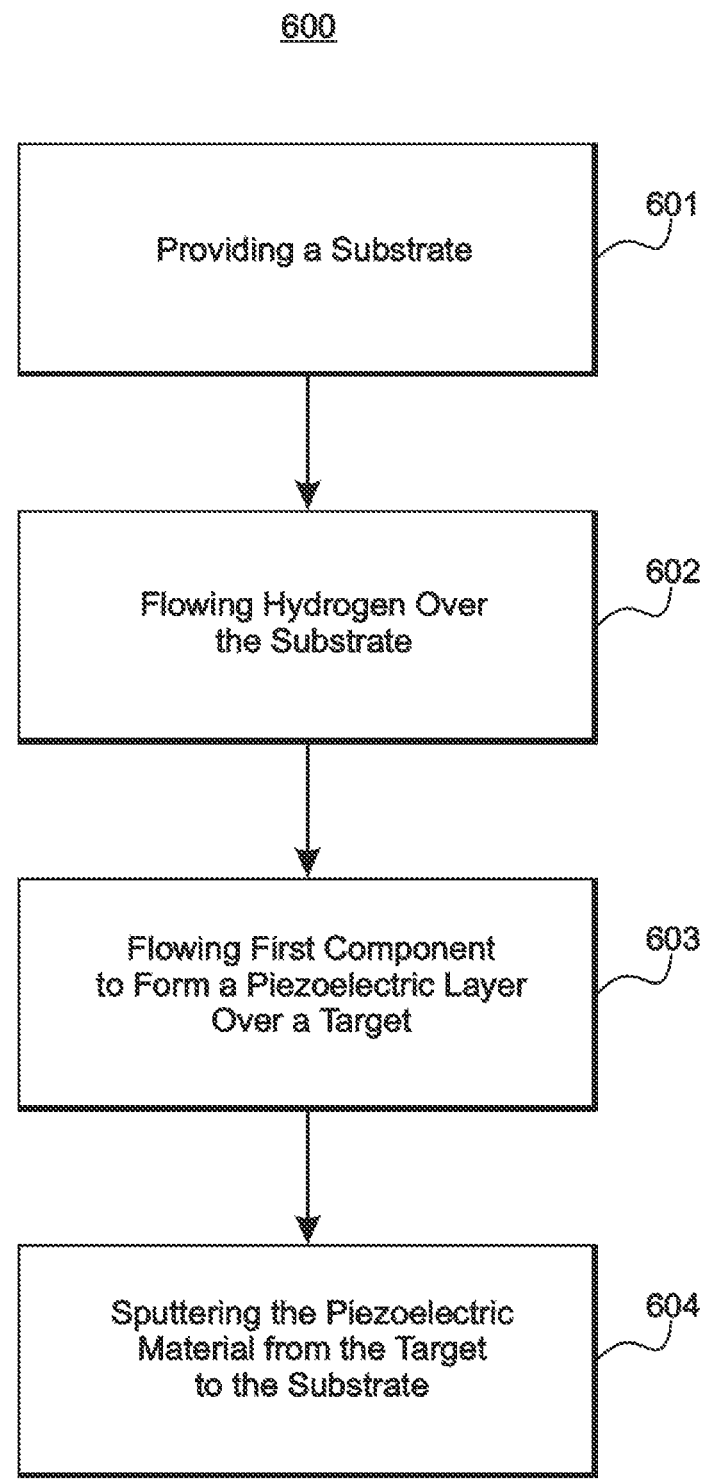
FIG. 6 shows a flow-chart of a method of fabricating a piezoelectric layer in accordance with a second representative embodiment.

FIG. 6 shows a flow-chart of a method 600 of fabricating a piezoelectric layer in accordance with a representative embodiment. Many of the details of the method 600 are common to the method 500, and may not be repeated in order to avoid obscuring the presently described embodiments.

The method 600 is described with direct reference to the components of FIGS. 2A, 2B and the deposition system 400 of FIG. 4 for illustrative purposes. Fabrication of other FBAR structures, such as SBAR 302, using the method 600, is also contemplated. As will become clearer as the present description continues, the method 600 may be used to form type-$C_N$ piezoelectric layer 104 having a rare-earth element doped piezoelectric material over the upper surface 107 of the first electrode 103. As alluded to above, the method 600 may be used to provide the first piezoelectric layer 304 over the upper surface 307 of the first electrode 303 and the second piezoelectric layer 311 over the upper surface 309 of the second electrode 305 of the SBAR 302 by repeating the process after forming the intervening layer(s) of the SBAR 302.

At 601 the method comprises providing a substrate. Illustratively, the substrate formed in 601 comprises first electrode 103, which is formed over the substrate 101. For purposes of description of the method 600, the first electrode 103 comprises a metal that is sputter-deposited over the substrate 101 by a known method. Notably, the formation of the cavity 106 in the substrate 101 may be carried out before fabrication of the layers of the acoustic stack 102 of FBAR 100, with the cavity 106 filled with a sacrificial material (not shown) such as phospho-silicate glass (PSG) during the fabrication of layers of the acoustic stack 102, and released after forming the layers of the acoustic stack 102. Alternatively, the acoustic isolator 110 is formed in the substrate 101 before forming of the first electrode 103 of FBAR 109.

At 602, the fabrication of the piezoelectric layer 104 begins with cleaning an upper surface 107 of the first electrode 103 before the forming of the piezoelectric layer 104. In a representative embodiment, this cleaning step comprises flowing Ar and $H_2$ to respective gas inlets 403, 404, 405 and from one of the gas outlets 406, 407, 408. An RF bias is applied to the first electrode 103 and the reaction chamber 401 is maintained at ground, so that the first electrode 103 functions as a cathode. As in method 500, an Ar plasma is formed and bombards the upper surface 107 of the first electrode 103. Illustratively, the RF power is provided in the range of approximately 15 W to approximately 1 kW, and the Ar bombardment of the upper surface 107 of the first electrode is maintained for a few seconds to a few minutes to ensure proper removal of contaminants. Notably, during this cleaning step, no voltage is applied to the first and second targets 409, 410; and therefore sputtering of material from first and second targets 409, 410 is insignificant. As such, and in contrast to the method 500, no seed layer (e.g., seed layer 108) is formed over the upper surface 107 of the first electrode 103.

The hydrogen plasma formed in the reaction chamber 401 bombards the upper surface 107 of the first electrode 103. The flow of $H_2$ in 402 provides ionized hydrogen (e.g., $H_2^+$ or $H^+$) in the reaction chamber 401 that provides a reducing agent at the upper surface 107. The ionized hydrogen is believed to react with many contaminants such as water, adsorbed oxides, nitrides and native oxides that may be present on the upper surface 107, and fosters their removal to provide a comparatively clean surface. Moreover, it is believed that the ionized hydrogen forms metal hydrides by saturating dangling bonds on the surface of the metal of the first electrode 103, and any exposed silicon surface. Furthermore, in an embodiment where the first electrode 103 comprises Pt, by the cleaning step with $H_2$, it is believed that contaminants such as adsorbed water, oxides and nitrides are believed to be removed on Pt, which does not readily form native oxides. Notably, however, because no electrical potential is applied to the first and second targets 409, 410 during 602, Al is not appreciably sputtered from the first and second targets 409, 410.

At 603 the method 600 comprises flowing a first component of the piezoelectric layer 104. In a representative embodiment used to form AlScN, the first component comprises nitrogen ($N_2$) gas. The flowing of nitrogen into the reaction chamber 401 comprises providing nitrogen to one of the gas inlets 403, 404, 405 and from one of the gas outlets 406, 407, 408, while continuing the flow of Ar to another of the gas inlets 403, 404, 405 and from the other of the gas outlets 406, 407, 408.

Notably, $H_2$ may be provided to the same gas outlet 406, 407, 408 that provides Ar; or a separate outlet (not shown) may be provided into the reaction chamber to provide an Ar/N/H atmosphere. Alternatively, after the completion of 602, hydrogen flow may be terminated. The flow rates of Ar and $N_2$ are set to control the stress of the resultant AlN. As described previously, a higher flow rate of Ar results in tensile stress in the AlN; and a lower flow rate of Ar results in compressive stress in the AlN. Similarly, a higher flow rate of $N_2$ results in tensile stress in the AlN; and a lower flow rate of $N_2$ results in compressive stress in the AlN. In representative embodiments, the flow rate of Ar is in the range of approximately 6 sccm to approximately 25 sccm, and the flow rate of $N_2$ is in the range of approximately 39 sccm to approximately 50 sccm.

During the flowing of nitrogen, AC power is supplied to the first and/or second target 409, 410, and the rare-earth element doped piezoelectric material is formed over the surface to the first or second target 409, 410, which comprises the alloy of the rare-earth element and the second component of the piezoelectric layer 104. Moreover, $NH_x$ compounds are believed to be formed in the reaction chamber 401. It is believed that $NH_x$ compounds formed in the reaction chamber 401 foster the formation of a form of AlN—H compound or ScN—H, due to reactions on the surface of the first and second targets 409, 410 between Al, Sc and NHx.

The greater the frequency of the AC power, the lower the deposition rate of AlScN. Accordingly, the frequency of the AC power generally should not exceed 100 kHz. Notably, if the flow of hydrogen is maintained during 603, the cleaning action of hydrogen is realized, but due to its comparatively small atomic mass, hydrogen does not appreciably sputter AlScN from the first and second targets 409, 410.

At 604, rare-earth element doped piezoelectric material is sputtered from the surface to the first or second target 409, 410, which comprises the alloy of the rare-earth element and the second component of the piezoelectric layer 104, and over the substrate 101. In a specific embodiment, AlScN—H formed on the surface to the first and/or second target 409, 410 is sputtered to the upper surface 107 of the first electrode 103. The metal hydrides formed at the upper surface 107 are believed to present an electronegative surface that attracts the aluminum of the AlN—H or the ScN—H, or both, sputtered from the first and/or second target 409, 410. Accordingly, the desired orientation (i.e., metal hydride-AlN—AlN—AlN or ScN—ScN—ScN) to form the crystal structure of type-$C_N$ AlScN rare-earth element doped piezoelectric material is provided and 603 continues until a suitable thickness of the type-$C_N$ AlScN material (e.g., forming piezoelectric layer 104) is realized. In one embodiment, the AlScN layer has a thickness of approximately 12,000 Å.

It is believed that hydrogen gas molecules ($H_2$) and atoms (H) attach to the AlScN on the surface of the metal of the first electrode 103. The hydrogen atoms then penetrate into the interior next to the Al or Sc side of the AlScN molecule to form an aluminum-hydride-nitride substance. The AlScN molecules are stretched apart to accommodate the hydrogen atoms. The physical structure of the H—AlScN molecule may also change. Then as a result of adsorption, the hydrided part of H—AlScN aligns and migrates to the surface of the metal hydride formed on the first electrode 103, combines into hydrogen molecules $H_2$ and pulls the Al part of AlScN toward to first electrode 103.

Figure 7:
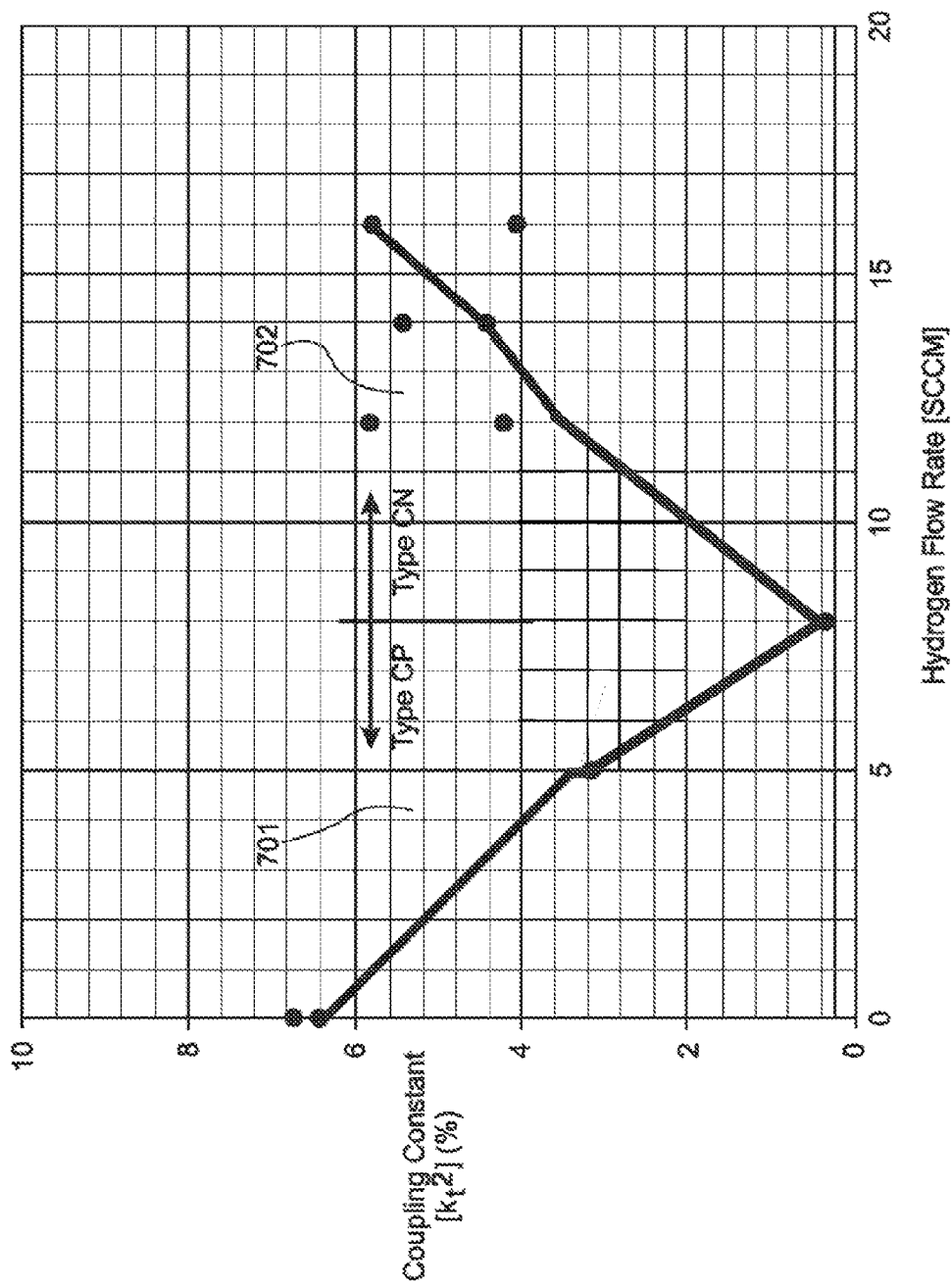
FIG. 7 shows a graph of the coupling coefficient versus hydrogen flow rate during the forming of a piezoelectric layer.

As noted above, the $H_2$ flow into the reaction chamber 401 may be continuous during the forming of the rare-earth element doped piezoelectric material. As described above, it is believed that the presence of ionized hydrogen in the reaction chamber provides a reducing agent that can remove contaminants such as oxides, nitrides and water, which can interfere with the forming of type-$C_N$ rare-earth element doped piezoelectric material, or can reduce the coupling coefficient ($kt^2$) of the rare-earth element doped piezoelectric material. In a representative embodiment, the flow rate of $H_2$ during the forming of the AlN is at least approximately 8 sccm. In certain embodiments, the flow rate of $H_2$ during the forming of the AlN is as great as approximately 30 sccm. Illustratively, a flow rate of $H_2$ of approximately 14 sccm provides a $C_N$ AlScN rare-earth element doped piezoelectric material with $kt^2$ of approximately 7.0% to approximately 7.5% with an atomic percentage of Sc of approximately 5.0%. The coupling coefficient $kt^2$ of AlScN fabricated with continuous flow of $H_2$ at the flow rates noted provides $C_N$ AlScN rare-earth element doped piezoelectric material with $kt^2$ of approximately 6.8% to approximately 7.3%. FIG. 7 shows the coupling coefficient versus hydrogen flow rate during the forming of the piezoelectric layer in 603.

After the piezoelectric layer 104 is formed, the second electrode 105 is formed over the piezoelectric layer 104. The second electrode 105 comprises a metal that is sputter-deposited over the piezoelectric layer 104 by a known method. Illustratively, the second electrode 105 comprises the same material as the first electrode 103.

The FBAR 200 and BAW resonator 201 described in connection with the method 600 comprise a single piezoelectric layer. As noted above, the acoustic stack of certain resonator structures comprises more than one piezoelectric layer. It is emphasized that the method 600 may be repeated to form a second type-$C_N$ AlN piezoelectric layer. For example, by repeating the method 600 in a selected sequence, SBAR 302 comprising first and second piezoelectric layers 304, 311, respectively, are formed over respective upper surfaces 307, 309 of first and second electrodes 303, 305.

In certain applications, two or more piezoelectric layers may be included in the acoustic stack, and have opposing C-axes. For example, in an acoustic stack described in U.S. Pat. No. 7,515,018, the C-axes of the piezoelectric layers may be antiparallel. As can be appreciated, in a structure comprising two piezoelectric layers in an acoustic stack, the first piezoelectric may be type-$C_N$ piezoelectric (e.g., first and second piezoelectric layer 304), and the second piezoelectric layer 311 may be type-$C_P$ piezoelectric layer comprising a rare-earth element doped piezoelectric material. In such an embodiment, the deposition system 400 would be used to form the type-$C_N$ piezoelectric layer by method 600, and the type-$C_P$ piezoelectric layer would be formed by a known method using deposition system 400.

If the second piezoelectric layer (e.g., second piezoelectric layer 311) is type-$C_N$ AlScN rare-earth element doped piezoelectric material, the cleaning step of method 600 would be carried out to remove contaminants from the electrode over which the second piezoelectric layer is formed (e.g., second electrode 305). If there is no intervening acoustic decoupling layer or intervening electrode, the cleaning step of the method 600 would be carried out to remove contaminants from the surface (e.g., upper surface 309) of the second electrode 305. The forming of the second piezoelectric layer would be effected by repeating 603 of the method 600.

In certain applications, two or more piezoelectric layers may be included in the acoustic stack, and have opposing C-axes. For example, in the acoustic stacks described in U.S. patent application Ser. No. 12/201,641 and U.S. Pat. No. 7,515,018, the C-axes of the piezoelectric layers may be antiparallel. As can be appreciated, in a structure comprising two piezoelectric layers in an acoustic stack, the first piezoelectric may be type-$C_N$ (e.g., first piezoelectric layer 304), and the second piezoelectric layer (e.g., second piezoelectric layer 311) may be type-$C_P$. In such an embodiment, the deposition system 400 would be used to form the type-$C_N$ piezoelectric layer by method 600, and the type-$C_P$ piezoelectric layer would be formed by a known method using deposition system 400.

Figure 8:
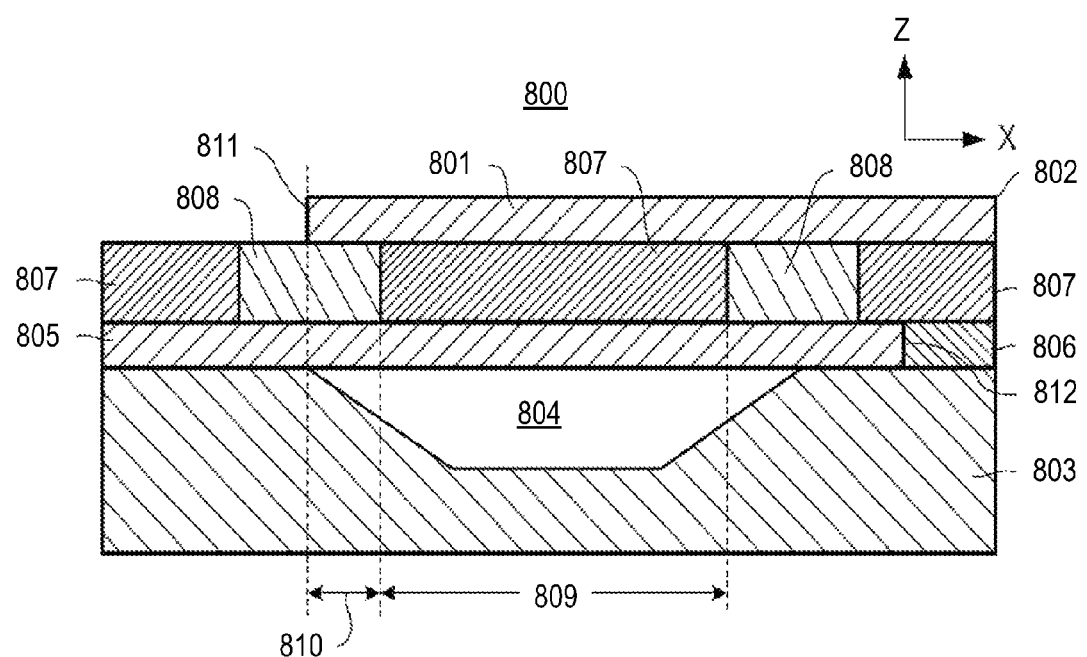
FIG. 8 is a cross-sectional view illustrating methods of fabricating piezoelectric layers over a substrate in accordance with representative embodiments.

FIG. 8 shows a cross-sectional view of FBAR 800 in accordance with a representative embodiment. The FBAR 800 comprises a top electrode 801 (referred to below as second electrode 801), illustratively comprising five (5) sides, with a connection side 802 configured to provide the electrical connection to an interconnect (not shown). The interconnect provides electrical signals to the top electrode 801 to excite desired acoustic waves in piezoelectric layers of the FBAR 800.

A substrate 803 comprises a cavity 804 or other acoustic reflector (e.g., a distributed Bragg grating (DBR) (not shown)). A first electrode 805 is disposed over the substrate 803 and is suspended over the cavity 804. A planarization layer 806 is provided over the substrate 803 and may be non-etchable borosilicate glass (NEBSG). In general, planarization layer 806 does not need to be present in the structure (as it increases overall processing cost), but when present, it may serve to improve the quality of growth of subsequent layers (e.g., highly textured c-axis rare-earth element doped piezoelectric material), improve the performance of the FBAR 800 through the reduction of "dead" resonator (FBAR) regions and simplify the fabrication of the various layers of the FBAR 800. Additionally, as described more fully below, a barrier layer (not shown in FIG. 8) is provided between the substrate 803 and the first electrode 805.

A first piezoelectric layer 807 is provided over the first electrode 805, and comprises highly-textured c-axis rare-earth element doped piezoelectric material such as aluminum nitride (AlScN). The c-axis of the first piezoelectric layer 807 is oriented along a first direction (e.g., parallel to the +z-direction in the coordinate system depicted in FIG. 1B). The first piezoelectric layer 807 may be referred to herein as the "p" layer, or type $C_p$ piezoelectric layer. A second piezoelectric layer 808 adjacent to the first piezoelectric layer has a second c-axis oriented in a second direction (e.g., parallel to the −z-direction in the coordinate system depicted in FIG. 1B) that is substantially antiparallel to the first direction. The second piezoelectric layer 808 comprises a rare-earth element doped piezoelectric material such as aluminum nitride (AlScN). The second piezoelectric layer 808 may be referred to herein as the "inverse-piezoelectric (ip)" or Type $C_N$ piezoelectric layer. In representative embodiments, the first piezoelectric layer 807 has a thickness (z-direction in the coordinate system of FIG. 8) that is substantially identical to that of the second piezoelectric layer 808.

The first and second piezoelectric layers 807, 808 are fabricated according to representative embodiments described above. Many of the details of the fabrication methods used to fabricate the first and second piezoelectric layers 807, 808 comprising a rare-earth element doped piezoelectric material are not repeated to avoid obscuring the description of the representative embodiments.

The crystals of both the first piezoelectric layer 807 (p-layer) and the second piezoelectric layer 808 (ip-layer) grow in columns that are perpendicular to the plane of the electrodes. As such, the c-axis orientations of crystals of the first piezoelectric layer 807 are substantially aligned with one another and the c-axis orientations of crystals of the second piezoelectric layer 808 are substantially aligned with one another land are antiparallel to the c-axis orientations of crystals of the first piezoelectric layer 807. The first piezoelectric layer 807 and the second piezoelectric layer 808 are typically made from the same substance (e.g., AlScN). The second electrode 801 is disposed over the first piezoelectric layer 807 and over the second piezoelectric layer 808.

In the representative embodiment depicted in FIG. 8, the first piezoelectric layer 807 and the second piezoelectric layer 808 are disposed adjacent to each other, and in this specific embodiment, in contact with each other. As should be appreciated by one of ordinary skill in the art, in certain applications (e.g., in certain structures described in U.S. patent application Ser. No. 13/286,051 to Burak, et al. and referenced above), it is useful if not required to have the first piezoelectric layer 807 and the second piezoelectric layer 808 immediately next to and in contact with each other. In other applications (e.g., to provide a single-ended input to a differential output), the first piezoelectric layer 807 and the second piezoelectric layer 808 may be next to each other, having another material, or air, disposed between the first piezoelectric layer 807 and the second piezoelectric layer 808.

The overlap of the cavity 804, the first electrode 805, the first piezoelectric layer 807, and the second electrode 801 defines an active region 809 of the FBAR 800. As described in U.S. patent application Ser. No. 13/286,051 to Burak, et al., acoustic losses at the boundaries of FBAR 800 are mitigated to improve mode confinement in the active region 809. In particular, the width of an overlap 810 of the second electrode 801 and the second piezoelectric layer 808 is selected to reduce acoustic losses resulting from scattering of acoustic energy at a termination edge 811 of the second electrode 801 and away from the active region 809. Similarly, the location of the termination edge 812 of the first electrode 805 is selected to reduce acoustic losses resulting from scattering of acoustic energy at the termination edge 812.

For simplicity of description, it is assumed that in regions adjacent to termination edges 811, 812, only the imaginary thickness extensional (TE) mode exists. In addition, it is assumed that only an evanescent TE mode is predominantly excited by the E-field, and that propagating TE modes and their affects are ignored as being insignificant. In a known FBAR device that does not include the p-layer/ip-layer structure of the present teachings, the solutions to the wave equation reveal that the field displacement Uz at the termination edges of the lower and upper electrodes is excited at a comparatively large amplitude, and the impedance discontinuity at the termination edges of the lower and upper electrodes will cause a significant scattering of energy from the excited TE modes to all other modes supported by the structure, thus yielding acoustic losses and reduced Q.

The first electrode 805 and the second electrode 801 may be one of a variety of conductive materials, such as metals suitable as electrodes in BAW applications. Generally, materials suitable for the first electrode 805 and the second electrode 801 comprise Refractory metals, Transition metals or Noble Metals. In specific embodiments, the first and second electrodes 805, 801 illustratively comprise one or more of molybdenum (Mo), aluminum (Al), tungsten (W), platinum (Pt), ruthenium (Ru), niobium (Nb), hafnium (Hf) and uranium-238 (U-238), or other low-loss metals, and are fabricated using a known method. The first piezoelectric layer 807 is fabricated in accordance with the present teachings.

FIGS. 9A-9I are cross-sectional views illustrating methods of fabricating piezoelectric layers over a substrate in accordance with representative embodiments. As described more fully below, in the presently described representative embodiments, the formation of adjacent type $C_P$ and type $C_N$ piezoelectric layers over a common substrate occurs under conditions conducive to the formation of type $C_N$ ("$C_N$ recipe") rare-earth element doped piezoelectric material described above, with the selective use of materials and processing parameters to foster the selective growth of a type $C_N$ piezoelectric layer. The structures formed according to the methods of the representative embodiments can be selectively implemented in one or more of a variety of BAW devices comprising piezoelectric layers having opposite polarity (p-layer/ip layer) formed over the same substrate and adjacent to one another.

Many aspects of the resultant devices are common to the FBAR 800 described in FIG. 8 and to the BAW resonator devices described in the parent application to Burak, et al., and transformers (e.g., FACT transformers) to Larson, et al., as well as other known structures and structures within the purview of one of ordinary skill in the art, having had the benefit of review of this application. Known materials and structures, as well as certain known aspects of processing used in forming such devices are generally not repeated in order to avoid obscuring the description of the methods of the representative embodiments.

Figure 9A:
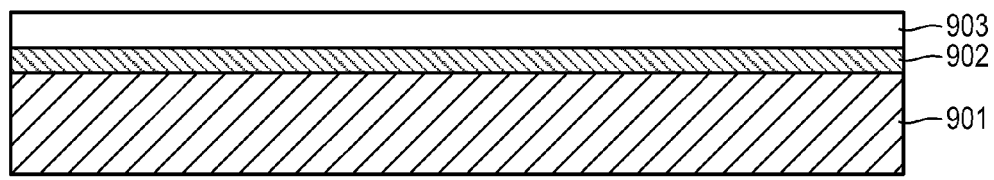
FIGS. 9A-9I are cross-sectional views illustrating methods of fabricating piezoelectric layers over a substrate in accordance with representative embodiments.

Turning first to FIG. 9A, a substrate 901 is provided and a barrier layer 902 is provided over the substrate 901. Illustratively, the substrate 901 is single-crystal silicon (Si) or other material selected for its suitability as a substrate of a bulk acoustic wave (BAW) device formed thereover. The barrier layer 902 is, for example, borosilicate glass (BSG) or silicon carbide (SiC) formed by known techniques. A first electrode layer 903 is formed over the barrier layer 902.

The barrier layer 902 is necessary due to the use of hydrogen plasma and the heating of the substrate 901 during the formation of type-$C_N$ material described below, and in the parent application of Larson, et al. The barrier layer 902 is useful in preventing the formation of silicides, which can result in undesirable flaking and can dissolve upon exposure to hydrofluoric (HF) acid used in subsequent processing. Generally, the barrier layer 902 has a thickness of less than 1000 Å, and more specifically has a thickness of approximately 200 Å to approximately 1000 Å.

Figure 9B:

Turning to FIG. 9B, an electronegative layer 904 is provided over the first electrode layer 903 in order to foster growth of type $C_P$ rare-earth element doped piezoelectric material in a selected location(s). In a representative embodiment, the first electrode layer 903 is molybdenum (Mo), and the electronegative layer 904 comprises molybdenum oxide ("moly oxide") having a thickness of approximately 100 Å. More generally, the electronegative layer 904 comprises a native oxide of the metal selected for the first electrode layer 903. Alternatively, the electronegative layer can be made of dielectric materials such as $SiO_2$, SiN, or $Al_2O_{10}$. Still alternatively, residual gases in the piezoelectric deposition chamber ($N_2$ or $O_2$) could provide a sufficient dielectric layer over the first electrode layer 903 to promote growth of type-$C_P$ rare-earth element doped piezoelectric material.

Generally, the thickness of the electronegative layer 904 is selected to ensure a suitable thickness for growth of type $C_P$ rare-earth element doped piezoelectric material after removal of some of the electronegative layer (e.g., moly oxide) during preparation of the first electrode layer 903 for growth of type $C_N$ rare-earth element doped piezoelectric material in a subsequent step described below.

Figure 9C:
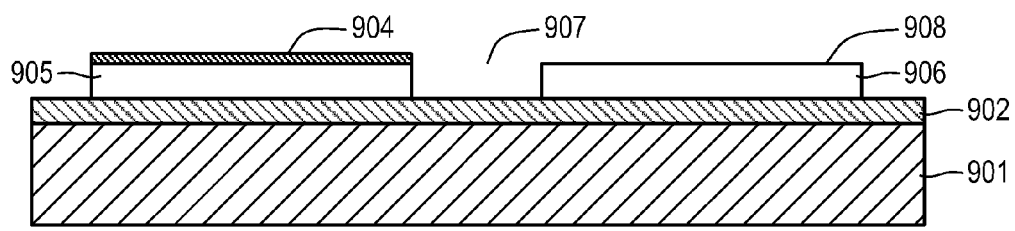

As depicted in FIG. 9C, the electronegative layer 904 is patterned, and the first electrode layer 903 is patterned to form a first lower electrode 905 and a second lower electrode 906 next to one another, but separated by a gap 907. Also, it is noted that the electronegative layer 904 is selectively removed to provide a portion 908 of the second lower electrode 906 that is unprotected during subsequent processing. The electronegative layer 904 acts as a seed layer for growth of type $C_P$ rare-earth element doped piezoelectric material thereover, under conditions designed to foster growth of type $C_N$ rare-earth element doped piezoelectric material.

Figure 9D:
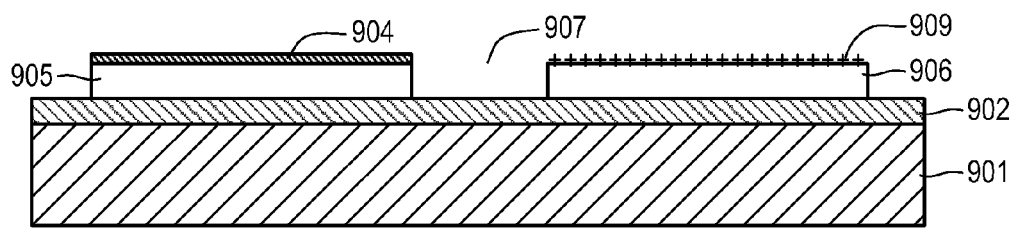

Turning to FIG. 9D, the resultant structure of FIG. 9C is provided in the piezoelectric deposition chamber, where hydrogen is flowed and hydrogen plasma is formed to activate the portion 908 for growth of type $C_N$ rare-earth element doped piezoelectric material according to the representative methods described in the parent application to Larson, et al. Notably, the flow of hydrogen plasma functions as a cleaning sequence to remove oxides and other contaminants that can form over portion 908, and results in an electropositive surface 909 at the portion 908. In a representative embodiment, the electropositive surface 909 is a substantially bare molybdenum surface and provides an active growth area for forming type $C_N$ AlN rare-earth element doped piezoelectric material over the portion 908.

To foster initial growth of type $C_N$ rare-earth element doped piezoelectric material over the portion 908, the flow of hydrogen is initially comparatively high. Illustratively, the flow rate of hydrogen is approximately 16 sccm to approximately 18 sccm. After initial growth of type $C_N$ rare-earth element doped piezoelectric material over the portion 908 the flow rate of hydrogen can be reduced to a level at which $C_N$ rare-earth element doped piezoelectric material will continue to grow over the portion 908, while allowing the growth of type $C_P$ rare-earth element doped piezoelectric material over the electronegative layer 904 that remains over the first lower electrode 905. Illustratively, the flow rate of hydrogen is reduced to approximately 6 sccm to approximately 8 sccm. The continued flow of hydrogen at the reduced level substantially prevents formation of deleterious silicides, oxides and other contaminants, while allowing growth of type $C_P$ rare-earth element doped piezoelectric material over the electronegative layer 904 during growth conditions that foster growth of type $C_N$ rare-earth element doped piezoelectric material.

Figure 9E:
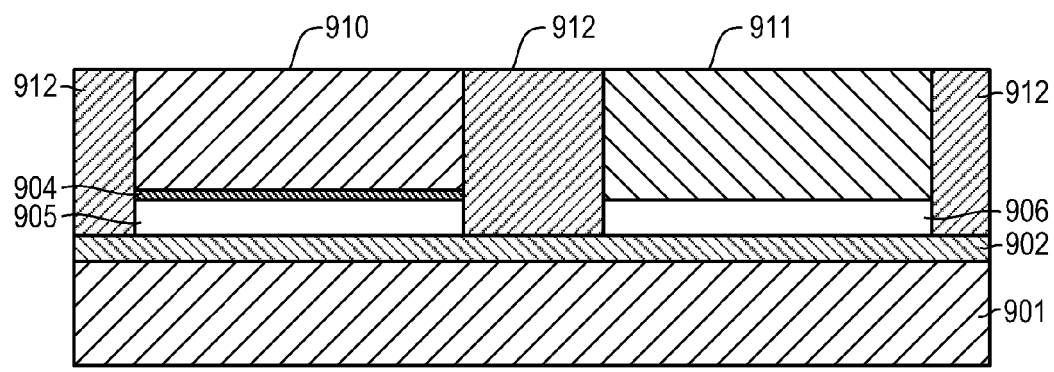

FIG. 9E depicts the resultant structure having a type $C_P$ piezoelectric layer 910 formed over the electronegative layer 904 and the first lower electrode 905, and a type $C_N$ piezoelectric layer 911 formed over the second lower electrode 906. Beneficially, the type $C_P$ piezoelectric layer 910 is a highly textured C-axis rare-earth element doped piezoelectric material. Accordingly, the C-axis orientations of the crystals of the type $C_P$ rare-earth element doped piezoelectric material are well-collimated, and as such are parallel with one another (i.e., oriented in the z-direction of the coordinate system depicted in FIG. 9E) and perpendicular to the plane (i.e., the x-y plane of the coordinate system depicted in FIG. 9E) of first lower electrode 905 over which the type $C_P$ piezoelectric layer 910 is formed. Similarly, the type $C_N$ piezoelectric layer 911 is a highly textured C-axis rare-earth element doped piezoelectric material. Accordingly, the C-axis orientations of the crystals of the type $C_N$ rare-earth element doped piezoelectric material are well-collimated, and as such are parallel with one another (i.e., oriented in the negative z-direction of the coordinate system depicted in FIG. 9E) and perpendicular to the plane (i.e., the x-y plane of the coordinate system depicted in FIG. 9E) of second lower electrode 906 over which type $C_P$ piezoelectric layer 910 is formed.

The type $C_P$ piezoelectric layer 910 and the type $C_N$ piezoelectric layer 911 are formed substantially simultaneously in the same chamber and under conditions conducive to the formation of type $C_P$ material. As noted above, the flow rate of hydrogen is comparatively high during the formation of an initial thickness (e.g., 1000 Å) of type $C_N$ rare-earth element doped piezoelectric material, and after the formation of the initial thickness of type $C_N$ rare-earth element doped piezoelectric material at a comparatively reduced flow rate of hydrogen. Again, many of the details of the growth of the type $C_P$ piezoelectric layer 910 and the type $C_N$ piezoelectric layer 911 are described in the parent application to Larson, et al., with modifications of materials and processing parameters described herein to foster selective growth of type $C_N$ rare-earth element doped piezoelectric material and type $C_P$ rare-earth element doped piezoelectric material adjacent to one another.

During formation of the type $C_P$ piezoelectric layer 910 and the type $C_N$ piezoelectric layer 911, a layer 912 of material (e.g., AlScN) is formed over the unprepared barrier layer 902 in the gap 907 between the type $C_P$ piezoelectric layer 910 and the type $C_N$ piezoelectric layer 911. By contrast to type $C_P$ piezoelectric layer 910 and type $C_N$ piezoelectric layer 911, layer 912 is generally a polycrystalline material that exhibits little or no piezoelectric effects because many facets initiate crystal growth in a variety of directions. As such, layer 919 generally does not exhibit piezoelectric properties, and can be removed.

Figure 9F:
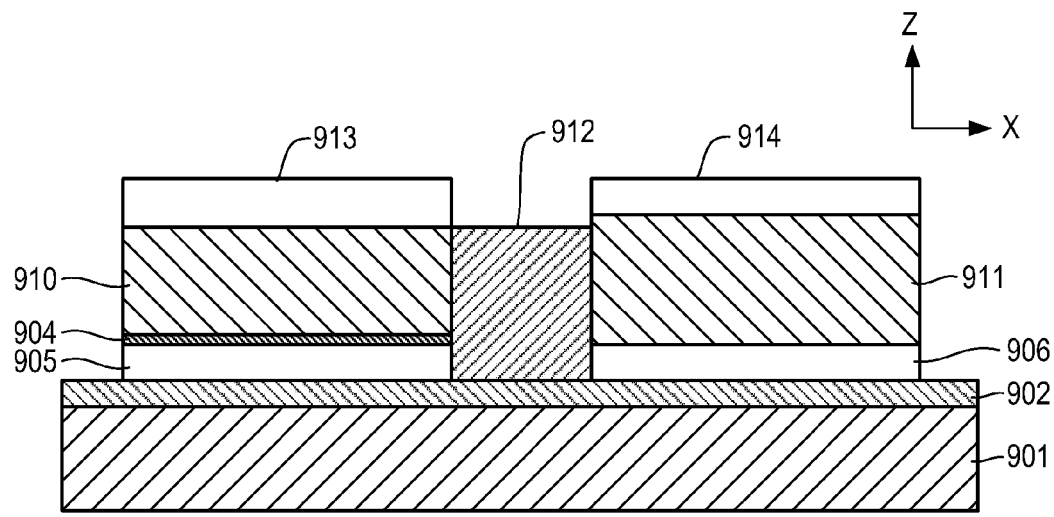

FIG. 9F depicts the resultant structure after the formation of first upper electrode 913 and second upper electrode 914 over the type $C_P$ piezoelectric layer 910 and the type $C_N$ piezoelectric layer 911, respectively.

As will be appreciated by one of ordinary skill in the art, the resultant structure depicted in FIG. 9F provides the type $C_P$ piezoelectric layer 910 and the type $C_N$ piezoelectric layer 911 adjacent to one another and over the same substrate, which can be the basis of a variety of devices. For example, by bussing the first and second lower electrodes 905, 906 together, and bussing the first and second upper electrodes 913, 914 and selectively connecting the first and second lower electrodes 905, 906 to a source of electrical power, a transformer (e.g. a FACT transformer) can be provided.

Figure 9G:
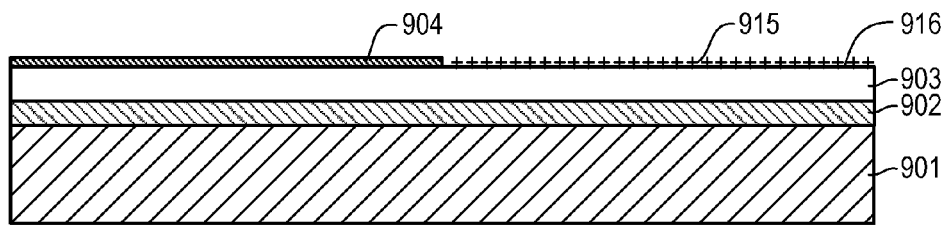

In other embodiments, the type $C_P$ piezoelectric layer 910 and the type $C_N$ piezoelectric layer 911 can be fabricated immediately next to one another and in contact with one another (i.e., without gap 907 and layer 912 between the type $C_P$ piezoelectric and type $C_N$ piezoelectric layers 910, 911). This structure can be fabricated through a slight variation in the processing sequence depicted in FIGS. 9A-9F of the representative embodiments described in connection therewith. Notably, after the formation of the electronegative layer 904 at FIG. 9B, the method continues as depicted in FIG. 9G, in which the first electrode layer 903 is not patterned as described in connection with the processing sequence of FIG. 9C, but rather remains a single layer. Rather, the electronegative layer 904 is patterned and removed from one side of the first electrode layer 903 to reveal portion 915.

The structure depicted in FIG. 9G is provided in the piezoelectric deposition chamber, and hydrogen is flowed and hydrogen plasma is formed to activate the portion 915 for growth of type $C_N$ rare-earth element doped piezoelectric material according to the representative methods described in the parent application to Larson, et al. As described above, the flow of hydrogen plasma functions as a cleaning sequence to remove oxides and other contaminants that can form over portion 915, and results in the formation of an electropositive surface 916 at the portion 915. In a representative embodiment, the electropositive surface 916 is a substantially bare molybdenum surface and provides as an active growth area for forming type $C_N$ AlN rare-earth element doped piezoelectric material over the portion 915.

To foster initial growth of type $C_N$ rare-earth element doped piezoelectric material over the portion 915, the flow of hydrogen is initially comparatively high (e.g., on the order of approximately 16 sccm to approximately 18 sccm). After initial growth of type $C_N$ rare-earth element doped piezoelectric material over the portion 915 the flow rate of hydrogen is reduced to a level at which $C_N$ rare-earth element doped piezoelectric material will continue to grow over the portion 915 (e.g., approximately 6 sccm to 8 sccm), while allowing the growth of type $C_P$ rare-earth element doped piezoelectric material over the electronegative layer 904 that remains over the first electrode layer 903. As noted above, the continued flow of hydrogen at the reduced level substantially prevents formation of deleterious silicides, while allowing growth of type $C_P$ rare-earth element doped piezoelectric material over the electronegative layer 904 during growth conditions that primarily foster growth of type $C_N$ rare-earth element doped piezoelectric material.

Figure 9H:
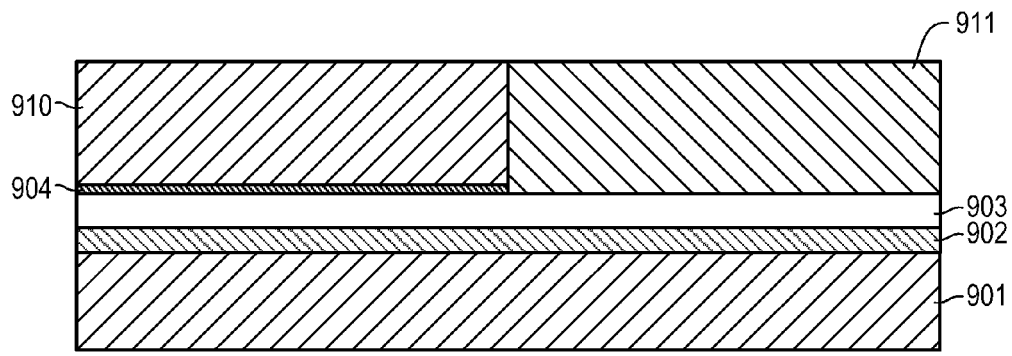

FIG. 9H depicts the resultant structure having type $C_P$ piezoelectric layer 910 comprising a rare-earth element doped piezoelectric material and formed over the electronegative layer 904 and type $C_N$ piezoelectric layer 911 formed over the first electrode layer 903. The type $C_P$ piezoelectric layer 910 and the type $C_N$ piezoelectric layer 911 are formed substantially simultaneously in the same chamber and under the same growth conditions, with an initially comparatively high flow rate of hydrogen and, after the initial formation of an initial thickness (e.g., less that 1000 Å) of the type $C_N$ rare-earth element doped piezoelectric material, at a comparatively reduced flow rate of hydrogen. Again, many of the details of the growth of the type $C_P$ piezoelectric layer 910 and the type $C_N$ piezoelectric layer 911 are described above, with modifications of materials and processing parameters described herein to foster selective growth of highly-textured type $C_N$ rare-earth element doped piezoelectric material and highly textured type $C_P$ rare-earth element doped piezoelectric material adjacent to one another.

As depicted in FIG. 9H, the type $C_P$ piezoelectric layer 910 and the type $C_N$ piezoelectric layer 911 are immediately next to one another and are in contact with one another. Next, as depicted in FIG. 9I, a second electrode 917 is formed over the type $C_P$ piezoelectric layer 910 and the type $C_N$ piezoelectric layer 911.

Figure 9I:
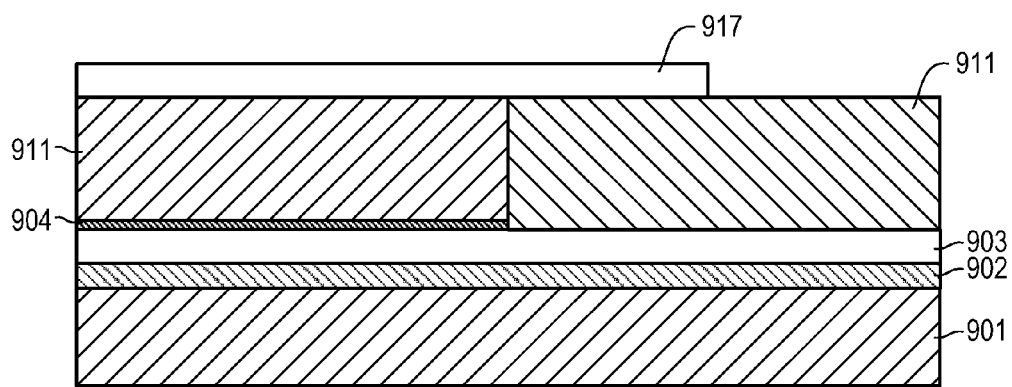

The structure depicted in FIG. 9I may be referred to as a "p/ip" structure such as in the parent application to Burak, et al. The p/ip structure lends itself to improvements in performance in FBAR devices, SBAR devices and CRF devices, as is described in the parent application to Burak, et al. Notably, the process sequence to form the type $C_P$ piezoelectric layer 910 and the type $C_N$ piezoelectric layer 911 immediately next to one another and in contact can be repeated to realize p/ip interfaces at other locations and levels of the selected acoustic stack for the desired BAW device.

Finally, it is noted that certain known components of BAW resonator structures (e.g., acoustic reflectors, frame elements and other structures) are contemplated for inclusion in the BAW resonator devices fabricated according to the methods of the representative embodiments. These structures are fabricated according to known methods, and their fabrication is integrated into the overall process flow for fabricating the desired BAW resonator device including the methods of the representative embodiments.

FIGS. 10A-10J are cross-sectional views illustrating methods of fabricating piezoelectric layers over a substrate in accordance with representative embodiments.

As described more fully below, in the presently described representative embodiments, the formation of adjacent type $C_p$ and type $C_N$ piezoelectric layers over a common substrate occurs under conditions conducive to the formation of type $C_p$ ("$C_p$ recipe") rare-earth element doped piezoelectric material described in the parent application to Larson, et al., with the selective use of materials and processing parameters to foster the selective growth of type $C_N$ piezoelectric layers. The structures formed according to the methods of the representative embodiments can be selectively implemented in one or more of a variety of BAW devices comprising piezoelectric layers having opposite polarity (p-layer/ip layer) formed over the same substrate and adjacent to one another. Many aspects of the resultant devices are common to the FBAR 800 described in connection with FIG. 8 and to the BAW resonator devices described in the parent application to Burak, et al., and transformers (e.g., FACT transformers), as well as other known structures and structures that are within the purview of one of ordinary skill in the art, having had the benefit of review of this application. Known materials and structures as well as certain known aspects of processing used in forming such devices are generally not repeated in order to avoid obscuring the description of the methods of the representative embodiments.

Figure 10A:
FIGS. 10A-10J are cross-sectional views illustrating methods of fabricating piezoelectric layers over a substrate in accordance with representative embodiments.

Turning first to FIG. 10A, a substrate 1001 is provided and a barrier layer 1002 is provided over the substrate. Illustratively, the substrate 1001 is single-crystal silicon (Si) or other material selected for its suitability as a substrate of a bulk acoustic wave (BAW) device formed thereover. A first electrode layer 1003 is formed over the barrier layer 1002. The barrier layer 1002 is, for example, borosilicate glass (BSG) or silicon carbide (SiC) formed by known techniques. The barrier layer 1002 is necessary due to the use of hydrogen plasma and heating of the substrate 1001 during the formation of type-$C_N$ material described below, and in the parent application of Larson, et al. The barrier layer 1002 is useful in preventing the formation of silicides, which can result in flaking and dissolve upon exposure to hydrofluoric (HF) acid used in subsequent processing.

Figure 10B:
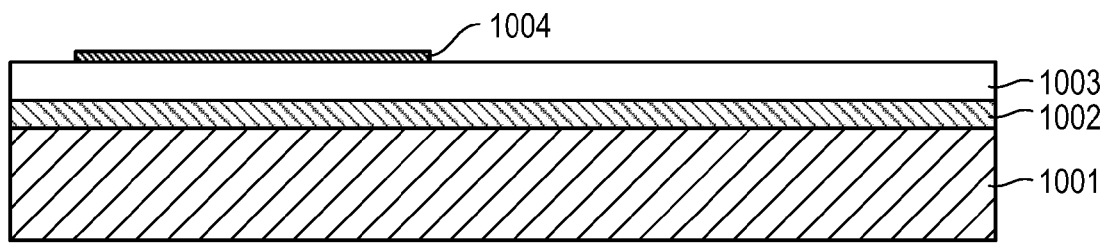

Turning to FIG. 10B, an electronegative layer 1004 is provided over the first electrode layer 1003 in order to foster growth of type $C_p$ rare-earth element doped piezoelectric material in a selected location(s). In a representative embodiment, the first electrode layer 1003 is molybdenum (Mo), and the barrier layer comprises molybdenum oxide ("moly oxide") having a thickness of approximately 100 Å. More generally, the electronegative layer 1004 comprises a native oxide of the metal selected for the first electrode layer 1003. Alternatively, the electronegative layer 1004 can be made of dielectric materials such as $SiO_2$, SiN, or $Al_2O_{10}$. Still alternatively, residual gases in the piezoelectric deposition chamber ($N_2$ or $O_2$) could provide a sufficient dielectric layer over the first electrode layer 1003 to promote growth of type-$C_P$ rare-earth element doped piezoelectric material.

The thickness of the electronegative layer 1004 is selected to ensure a suitable thickness for growth of type $C_p$ rare-earth element doped piezoelectric material after removal of some of the electronegative layer 1004 (e.g., moly oxide) during preparation of the first electrode layer 1003 for growth of type $C_N$ rare-earth element doped piezoelectric material in a subsequent step described below.

Figure 10C:
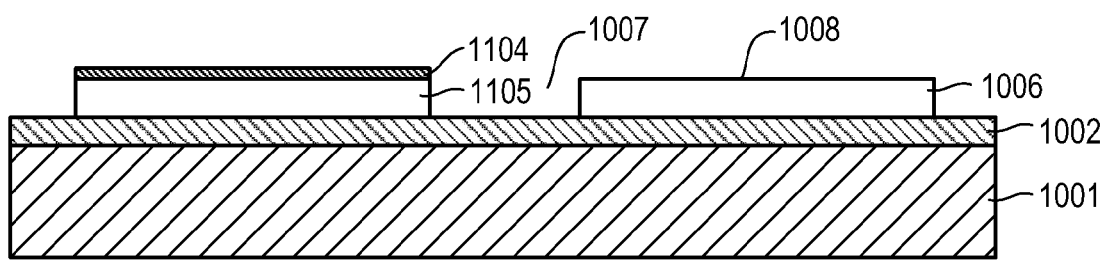

As depicted in FIG. 10C, the electronegative layer 1004 is patterned, and the first electrode layer 1003 is patterned to form a first lower electrode 1005 and a second lower electrode 1006 next to one another, but separated by a gap 1007. Also, it is noted that the electronegative layer 1004 is selectively removed to provide a portion 1008 of the second lower electrode 1006 that is unprotected during subsequent processing. As described more fully below, the electronegative layer 1004 acts as a seed layer for growth of type $C_P$ rare-earth element doped piezoelectric material thereover, under conditions designed to foster growth of type $C_N$ rare-earth element doped piezoelectric material.

Figure 10D:
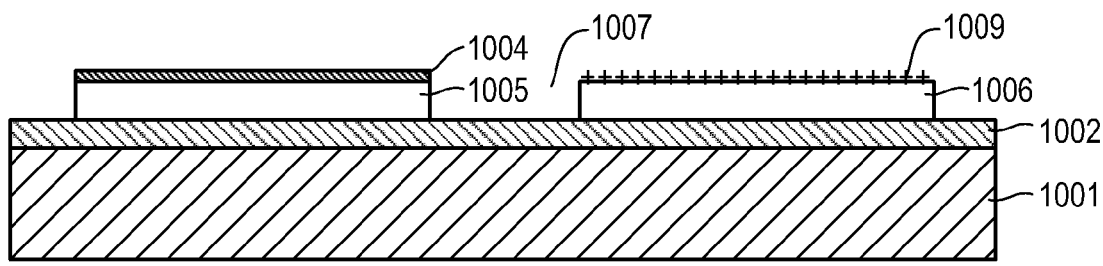

Turning to FIG. 10D, the resultant structure of FIG. 10C is provided in the piezoelectric deposition chamber, and hydrogen is flowed and hydrogen plasma formed. At this stage of the method, the flow rate of hydrogen is comparatively high. Illustratively, the flow rate of hydrogen is approximately 16 sccm to approximately 18 sccm. The flow of hydrogen plasma functions as a cleaning sequence to remove oxides and other contaminants that can form over portion 1008, and results in the formation of an electropositive surface 1009 at the portion 1008. In a representative embodiment, the electropositive surface 1009 is a substantially bare molybdenum surface and provides an active growth area for forming type $C_N$ AlN rare-earth element doped piezoelectric material over the portion 1008.

Figure 10E:
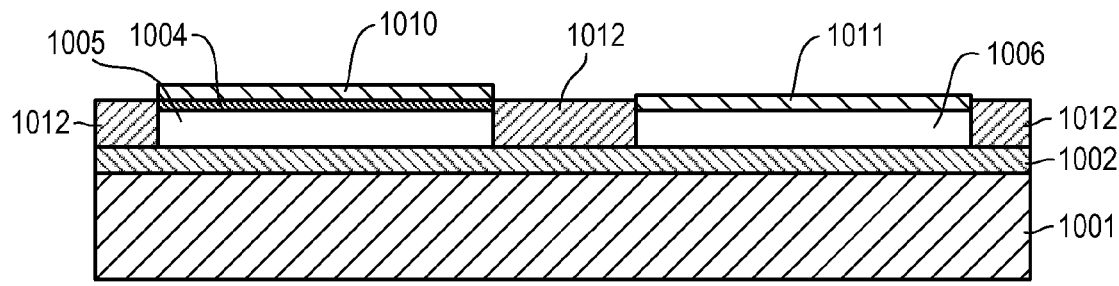
Figure 10F:
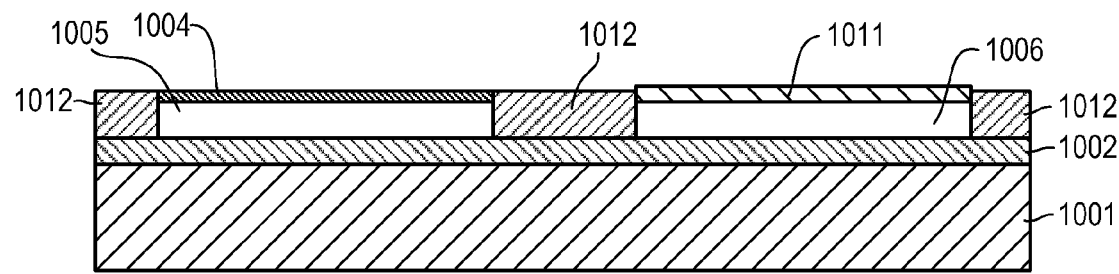

FIG. 10E depicts the resultant structure having a type $C_P$ piezoelectric layer 1010 formed over the electronegative layer 1004 and the first lower electrode 1005, and a type $C_N$ piezoelectric seed layer 1011 formed over the second lower electrode 1006. In accordance with a representative embodiment, the type $C_N$ piezoelectric seed layer 1011 comprises AlScN and fosters growth of type-$C_N$ AlScN. As described in the parent application to Larson, et al., the type $C_N$ piezoelectric seed layer 1011 has a thickness in the range of approximately 50 Å to approximately 1000 Å over the surface of the second lower electrode 1006.

The type $C_P$ piezoelectric layer 1010 and the type $C_N$ piezoelectric seed layer 1011 are formed substantially simultaneously in the same chamber under conditions conducive to the growth of type $C_N$ rare-earth element doped piezoelectric material as described in the parent application to Larson, et al. The growth of type $C_P$ piezoelectric layer 1010 occurs with the hydrogen flow continued, albeit at a lower flow rate (e.g., approximately 6 sccm to 8 sccm) to ensure growth of the type $C_N$ piezoelectric seed layer 1011 Illustratively, the type $C_N$ piezoelectric seed layer 1011 has a thickness of approximately 500 Å. Generally, the type $C_N$ piezoelectric seed layer 1011 has a thickness of approximately 50 Å to approximately 1000 Å. Layer 1012 is formed in areas over the barrier layer 1002 that have not been prepared to foster of growth of either type $C_N$ rare-earth element doped piezoelectric material or type $C_P$ rare-earth element doped piezoelectric material (e.g., in gap 1007). By contrast to type $C_P$ piezoelectric layer 1010 and type $C_N$ piezoelectric seed layer 1011, layer 1012 is generally a polycrystalline material that exhibits little or no piezoelectric effects because many facets initiate crystal growth in a variety of directions. As such, layer 1012 generally does not exhibit piezoelectric properties, and can be removed.

The structure depicted in FIG. 10E is removed from the piezoelectric deposition chamber, and the type $C_P$ piezoelectric layer 1010 initially formed over the electronegative layer 1004 is removed using known masking and etching techniques. The removal of the type $C_P$ piezoelectric layer 1010 reveals the electronegative layer 1004.

After the type $C_P$ piezoelectric layer 1010 is removed, the structure in FIG. 10F is again provided in the piezoelectric deposition chamber. Next, hydrogen is flowed at a comparatively high rate (e.g., approximately 16 sccm to approximately 18 sccm) and hydrogen plasma is formed. The flow of hydrogen plasma functions as a cleaning sequence to remove oxides and other contaminants that can form over portions of the electronegative layer 1004 and the type $C_N$ piezoelectric seed layer 1011 during the process of removing the type $C_P$ piezoelectric layer 1010.

After the cleaning sequence is completed, the electronegative layer 1004 and the type $C_N$ piezoelectric seed layer 1011 are exposed, and the simultaneous growth of type $C_P$ rare-earth element doped piezoelectric material and type $C_N$ rare-earth element doped piezoelectric material adjacent to one another begins. In the presently described embodiments, the growth of type $C_P$ rare-earth element doped piezoelectric material and type $C_N$ rare-earth element doped piezoelectric material occurs under conditions favorable to the growth of type $C_P$ rare-earth element doped piezoelectric material as described in the parent application to Larson, et al. Notably, hydrogen is flowed during the growth of the type $C_P$ rare-earth element doped piezoelectric material and type $C_N$ rare-earth element doped piezoelectric material at this stage of the process. The flow rate of the hydrogen is comparatively low (e.g., the flow rate is reduced to between approximately 6 sccm and 8 sccm) to maintain growth of the type $C_N$ rare-earth element doped piezoelectric material. Because of the preparation of the type $C_N$ piezoelectric seed layer 1011, type $C_N$ rare-earth element doped piezoelectric material is formed over the type $C_N$ piezoelectric seed layer 1011, whereas over the electronegative layer 1004, type $C_P$ rare-earth element doped piezoelectric material is formed.

Figure 10G:
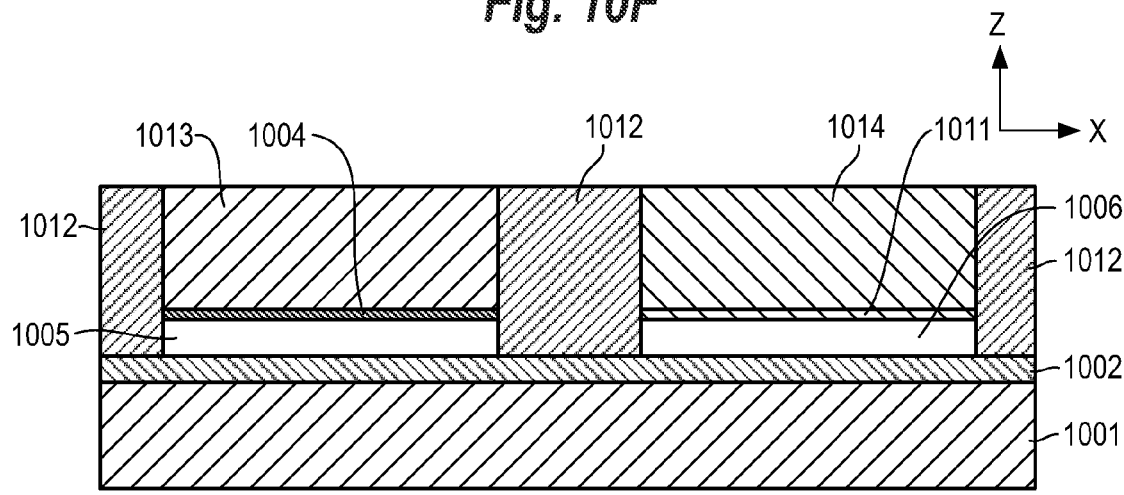

As depicted in FIG. 10G, a type-$C_P$ piezoelectric layer 1013 is formed over the electronegative layer 1004 and the first lower electrode 1005, and a type-$C_N$ piezoelectric layer 1014 is formed over the second lower electrode 1006. The type-$C_P$ piezoelectric layer 1013 and the type-$C_N$ piezoelectric layer 1014 are formed substantially simultaneously in the same chamber and under growth conditions conducive to the growth of type $C_P$ rare-earth element doped piezoelectric material. Beneficially, the type-$C_P$ piezoelectric layer 1013 is a highly textured C-axis rare-earth element doped piezoelectric material. Accordingly, the C-axis orientations of the crystals of the type $C_P$ rare-earth element doped piezoelectric material are well-collimated, and as such are parallel with one another (i.e., oriented in the z-direction of the coordinate system depicted in FIG. 10G) and perpendicular to the plane (i.e., the x-y plane of the coordinate system depicted in FIG. 10G) of first lower electrode 1005 over which the type-$C_P$ piezoelectric layer 1013 is formed. Similarly, the type-$C_N$ piezoelectric layer 1014 is a highly textured C-axis rare-earth element doped piezoelectric material. Accordingly, the C-axis orientations of the crystals of the type $C_N$ rare-earth element doped piezoelectric material are well-collimated, and as such are parallel with one another (i.e., oriented in the −z-direction of the coordinate system depicted in FIG. 10G) and perpendicular to the plane (i.e., the x-y plane of the coordinate system depicted in FIG. 10G) of second lower electrode 1006 over which type-$C_P$ piezoelectric layer 1013 is formed.

In a manner substantially identical to that described above in connection with FIG. 2F, first and second upper electrodes (not shown) can be formed over the type-$C_P$ piezoelectric layer 1013 and the type-$C_N$ piezoelectric layer 1014, respectively. These electrodes can then be connected to an electrical power source to provide a variety of BAW resonator devices (e.g., FACT transformers).

The type-$C_P$ piezoelectric layer 1013 and the type-$C_N$ piezoelectric layer 1014 can be provided immediately next to one another and in contact with one another (i.e., without gap 1007 and layer 1012 between the type-$C_P$ piezoelectric and type-$C_N$ piezoelectric layers 1013, 1014). This structure can be fabricated through a slight variation in the processing sequence depicted in FIGS. 10A-10F of the representative embodiments described in connection therewith. Notably, after the formation of the electronegative layer 1004 at FIG. 10B, the first electrode layer 1003 is not patterned as described in connection with the processing sequence of FIG. 10C, but rather remains as a single layer. Instead, the electronegative layer 1004 is patterned and removed from one side of the first electrode layer 1003.

The structure depicted in FIG. 10B is provided in the piezoelectric deposition chamber, and hydrogen is flowed and hydrogen plasma formed. At this stage of the method, the flow rate of hydrogen is comparatively high. Illustratively, the flow rate of hydrogen is approximately 16 sccm to approximately 18 sccm. The flow of hydrogen plasma functions as a cleaning sequence to remove oxides and other contaminants that can form on the first electrode layer 1003, and results in an electropositive surface (not shown) at the exposed portion of the first electrode layer 1003. As described above, in a representative embodiment the electropositive surface is a substantially bare molybdenum surface and provides an active growth area for forming type $C_N$ AlN piezoelectric seed layer directly on the first electrode layer.

The type $C_P$ piezoelectric layer 1010 and the type $C_N$ piezoelectric seed layer 1011 are formed substantially simultaneously in the same chamber under conditions conducive to the growth of type $C_N$ rare-earth element doped piezoelectric material as described in the parent application to Larson, et al. The growth of the piezoelectric layer (e.g., AlN) occurs with the hydrogen flow continued, albeit at a lower flow rate (e.g., approximately 6 sccm to 8 sccm) to ensure growth of the type $C_N$ piezoelectric seed layer 1011. Illustratively, the type $C_N$ piezoelectric seed layer 1011 has a thickness of approximately 500 Å. Generally, the type $C_N$ piezoelectric seed layer 1011 has a thickness of approximately 50 Å to approximately 1000 Å. Layer 1012 is formed in areas over the barrier layer 1002 that have not been prepared to foster of growth of either type $C_N$ rare-earth element doped piezoelectric material or type $C_P$ rare-earth element doped piezoelectric material (e.g., in gap 1007).

Figure 10H:
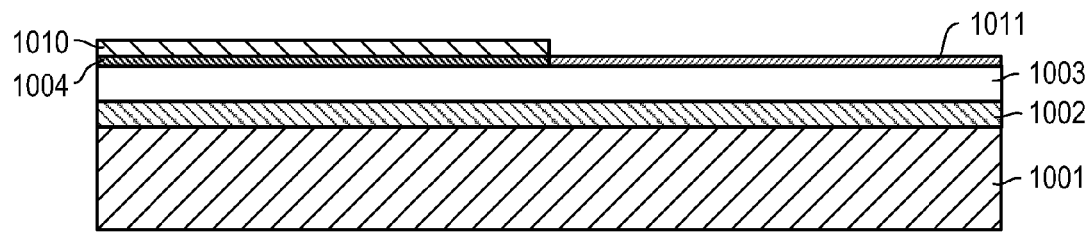

FIG. 10H depicts the resultant structure having type $C_P$ piezoelectric layer 1010 formed over the electronegative layer 1004 and the type $C_N$ piezoelectric seed layer 1011 formed over the first electrode layer 1003.

The structure depicted in FIG. 10H is removed from the piezoelectric deposition chamber, and the type $C_P$ piezoelectric layer 1010 initially formed over the electronegative layer 1004 is removed using known masking and etching techniques. The removal of the type $C_P$ piezoelectric layer 1010 reveals the electronegative layer 1004. The resultant structure is depicted in FIG. 10I.

Figure 10I:
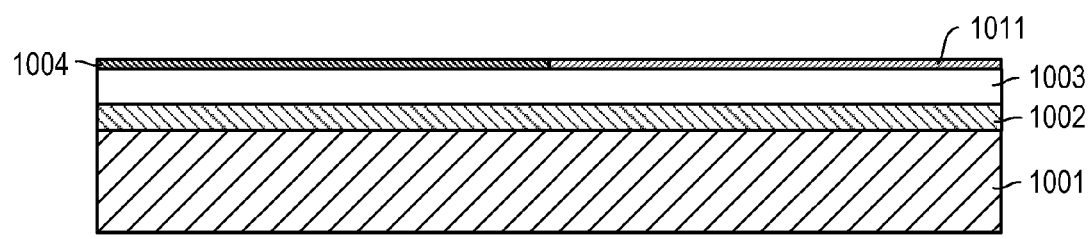

The structure depicted in FIG. 10I is returned to the piezoelectric deposition chamber and hydrogen is flowed and hydrogen plasma formed. At this stage of the method, the flow rate of hydrogen is again comparatively high. Illustratively, the flow rate of hydrogen is approximately 16 sccm to approximately 18 sccm. The flow of hydrogen plasma functions as a cleaning sequence to remove oxides and other contaminants that can form on the first electrode layer 1003 and on the type $C_N$ piezoelectric seed layer 1011 during the removal of the type $C_P$ piezoelectric layer 1010.

After the cleaning step is completed, the simultaneous growth of type Cr rare-earth element doped piezoelectric material and type $C_N$ rare-earth element doped piezoelectric material adjacent to one another is carried out. In the presently described embodiments, the growth of highly textured type $C_P$ rare-earth element doped piezoelectric material and highly textured type $C_N$ rare-earth element doped piezoelectric material occurs under conditions favorable to the growth of type $C_P$ rare-earth element doped piezoelectric material as described in the parent application to Larson, et al. Notably, hydrogen is flowed during the growth of the type $C_P$ rare-earth element doped piezoelectric material and type $C_N$ rare-earth element doped piezoelectric material at this stage of the process. The flow rate of the hydrogen is comparatively low to maintain growth of the type $C_N$ rare-earth element doped piezoelectric material. For example, the flow rate is reduced to between approximately 6 sccm and 8 sccm. Because of the preparation of the type $C_N$ piezoelectric seed layer 1011, type $C_N$ rare-earth element doped piezoelectric material is formed over the type $C_N$ piezoelectric seed layer 1011, whereas over the electronegative layer 1004, type $C_P$ rare-earth element doped piezoelectric material is formed.

Figure 10J:
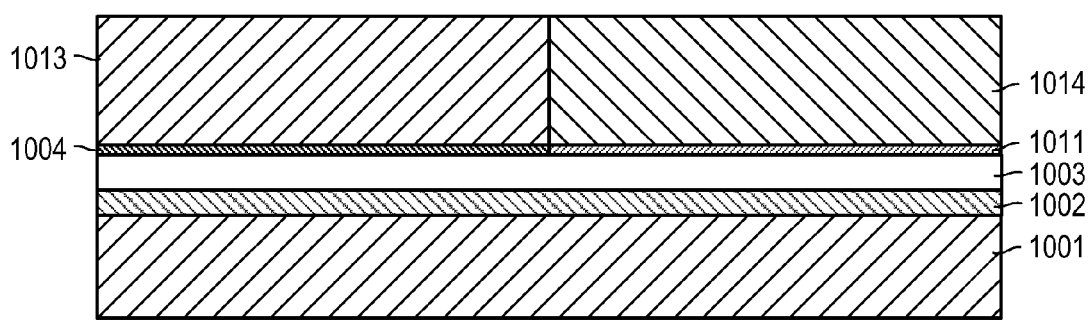

As depicted in FIG. 10J, a type-$C_P$ piezoelectric layer 1013 is formed over the electronegative layer 1004, and a type-$C_N$ piezoelectric layer 1014 is formed over the first electrode layer 1003. The type-$C_P$ piezoelectric layer 1013 and the type-$C_N$ piezoelectric layer 1014 are disposed immediately next to and on contact with each other, and are formed substantially simultaneously in the same chamber and under the same growth conditions.

In a manner substantially identical to that described above in connection with FIG. 21, an upper electrode (not shown) can be formed over the type-$C_P$ piezoelectric layer 1013 and the type-$C_N$ piezoelectric layer 1014, respectively. Again, the resultant structure may be referred to as a "p/ip" structure such as described in the parent application to Burak, et al. The p/ip structure lends itself to improvements in performance in FBAR devices, SBAR devices and CRF devices, as is described in the parent application to Burak, et al. Notably, the process sequence to form the type $C_P$ piezoelectric layer 1010 and the type $C_N$ piezoelectric seed layer 1011 immediately next to one another and in contact can be repeated to realize p/ip interfaces at other locations and levels of the selected acoustic stack for the desired BAW device.

It is again noted that certain known components of BAW resonator structures (e.g., acoustic reflectors, frame elements and other structures) are contemplated for inclusion in the BAW resonator devices fabricated according to the methods of the representative embodiments. These structures are fabricated according to known methods, and their fabrication is integrated into the overall process flow for fabricating the desired BAW resonator device including the methods of the representative embodiments.

FIGS. 11A-11H are cross-sectional views illustrating methods of fabricating piezoelectric layers over a substrate in accordance with representative embodiments.

As described more fully below, in the presently described representative embodiments, the formation of adjacent type $C_p$ and type $C_N$ piezoelectric layers over a common substrate occurs in conditions conducive to the formation of type $C_P$ ("$C_P$ recipe") described in the parent application to Larson, et al., with the selective use of a type $C_N$ piezoelectric seed layer and processing parameters selected to foster growth of both type $C_N$ rare-earth element doped piezoelectric material and type $C_N$ rare-earth element doped piezoelectric material.

The structures formed according to the methods of the representative embodiments can be selectively implemented in one or more of a variety of BAW devices comprising piezoelectric layers having opposite polarity (p-layer/ip layer) formed over the same substrate and adjacent to one another. Many aspects of the resultant devices are common to the FBAR 800 described in FIG. 8 and to the BAW resonator devices described in the parent application to Burak, et al., and transformers (e.g., FACT transformers), as well as other known structures and structures that are within the purview of one of ordinary skill in the art, having had the benefit of review of this application. Known materials and structures, as well as certain known aspects of processing used in forming such devices are generally not repeated in order to avoid obscuring the description of the methods of the representative embodiments.

Figure 11A:
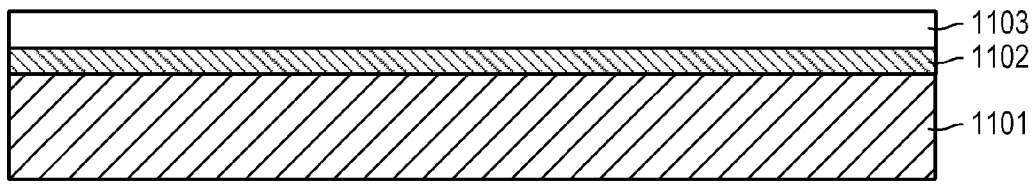
FIGS. 11A-11H are cross-sectional views illustrating methods of fabricating piezoelectric layers over a substrate in accordance with representative embodiments.

Turning first to FIG. 11A, a substrate 1101 is provided and a barrier layer 1102 is provided over the substrate. Illustratively, the substrate 1101 is single-crystal silicon (Si) or other material selected for its suitability as a substrate of a bulk acoustic wave (BAW) device formed thereover. The barrier layer 1102 is, for example, borosilicate glass (BSG) or silicon carbide (SiC) formed by known techniques. The barrier layer 1102 is necessary due to the use of hydrogen plasma and heating of the substrate 1101 during the formation of type-$C_N$ material described below, and in the parent application of Larson, et al. The barrier layer 1102 is useful in preventing the formation of silicides, which can result in flaking and dissolve upon exposure to hydrofluoric (HF) acid used in subsequent processing. A first electrode layer 1103 is formed over the barrier layer.

Figure 11B:
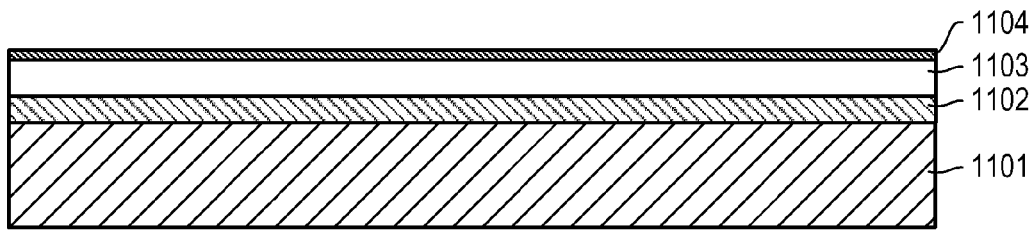

Turning to FIG. 11B, a type $C_N$ piezoelectric seed layer 1104 is provided over the first electrode layer 1103 in order to foster growth of type $C_N$ rare-earth element doped piezoelectric material in a selected location(s). In accordance with a representative embodiment, the type $C_N$ piezoelectric seed layer 1104 is aluminum (Al) and fosters growth of piezoelectric layer of type-$C_N$ AlScN. It is noted that the selection of Al as the type $C_N$ piezoelectric seed layer 1104 is merely illustrative. Alternatively, the type $C_N$ piezoelectric seed layer 1104 may be molybdenum (Mo), tungsten (W), platinum (Pt), ruthenium (Ru), niobium (Nb), hafnium (Hf) or uranium-2108 (U-2108). As described above and in the parent application to Larson, et al., the type $C_N$ piezoelectric seed layer 1104 has a thickness in the range of approximately 50 Å to approximately 1000 Å over the surface of the first electrode layer 1103.

Figure 11C:
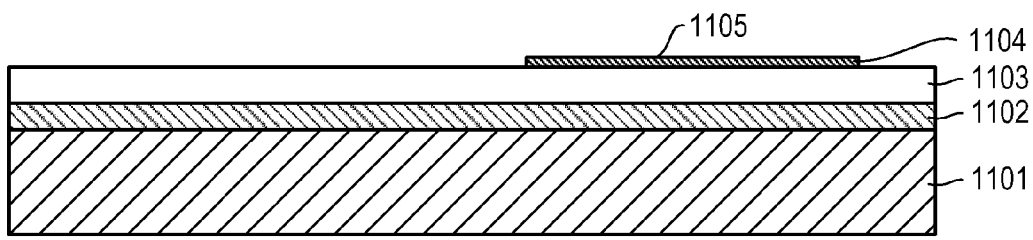

As depicted in FIG. 11C, the type $C_N$ piezoelectric seed layer 1104 is patterned to form a portion 05 over the first electrode layer 1103.

Figure 11D:
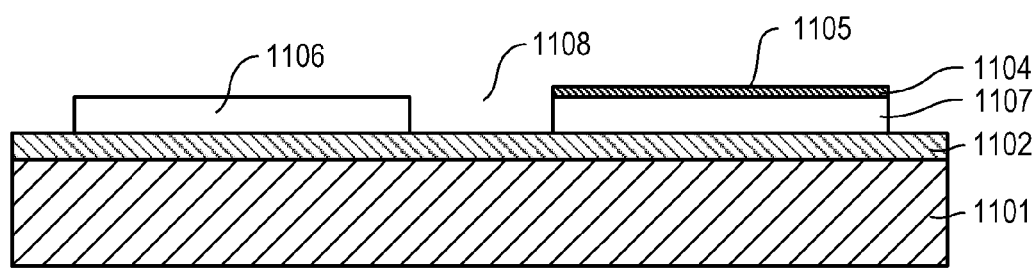

As depicted in FIG. 11D, the first electrode layer 1103 is patterned to form a first lower electrode 1106 and a second lower electrode 1107 next to one another, but separated by a gap 1108.

Figure 11E:
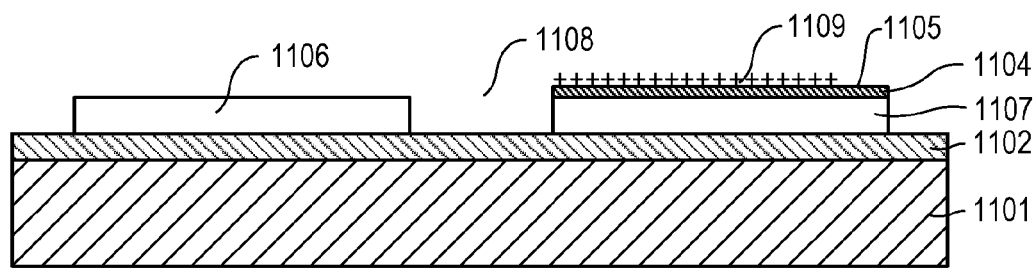

As depicted in FIG. 11E, the resultant structure of FIG. 11D is provided in the piezoelectric deposition chamber, hydrogen is flowed at a comparatively high rate (e.g., approximately 16 sccm to approximately 18 sccm) and hydrogen plasma is formed. The flow of hydrogen plasma functions as a cleaning sequence to remove oxides and other contaminants that can form over portion 1105 of the type $C_N$ piezoelectric seed layer 1104 and over the first lower electrode 1106 during the process of patterning the type $C_N$ piezoelectric seed layer 1104 and first lower electrode 1106. After the cleaning sequence is completed, the flow rate of hydrogen is reduced, and hydrogen plasma activates the portion 1105 of the type $C_N$ piezoelectric seed layer 1104 creating an electropositive surface 1109 for growth of type $C_N$ rare-earth element doped piezoelectric material according to the representative methods described in the parent application to Larson, et al.

Figure 11F:
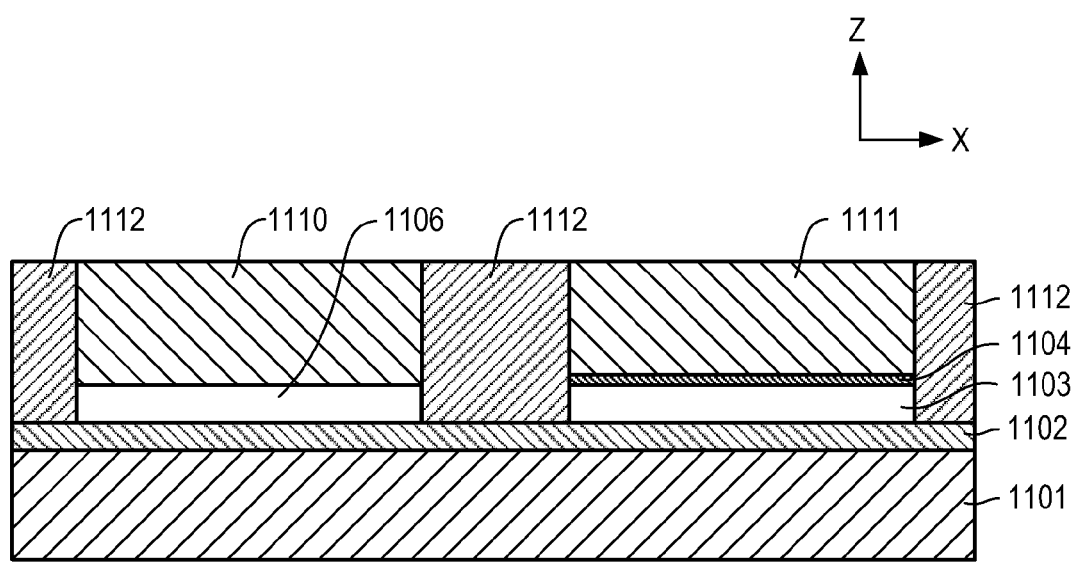

The structure depicted in FIG. 11E remains in the piezoelectric deposition chamber after the cleaning sequence with no vacuum break. As depicted in FIG. 11F, the method continues under conditions conducive to the formation of type $C_p$ ("$C_p$ recipe") described in the parent application to Larson, et al. Notably a type $C_p$ piezoelectric layer 1110 is formed over the first lower electrode 1106 and a type $C_N$ piezoelectric layer 1111 is formed over the portion 1105. In a representative embodiment, the growth of type $C_N$ AlScN occurs over the type $C_N$ piezoelectric seed layer 1104 at portion 1105, and the growth of type $C_p$ AlScN occurs over the first lower electrode 1106. A layer 1112 of material (e.g., AlScN) is formed over the unprepared barrier layer 1102 during the growth sequence of the type $C_p$ piezoelectric layer 1110 and the type $C_N$ piezoelectric layer 1111. In contrast to type $C_p$ piezoelectric layer 1110 and type $C_N$ piezoelectric layer 1111, layer 1112 is generally a polycrystalline material that exhibits little or no piezoelectric effects because many facets initiate crystal growth in a variety of directions. As such, layer 1112 generally does not exhibit piezoelectric properties, and can be removed.

The process continues under conditions conducive to the growth of type $C_p$ rare-earth element doped piezoelectric material as described above. The growth of the rare-earth element doped piezoelectric material (e.g., AlScN) occurs with the hydrogen flow continued, albeit at a lower flow rate (e.g., approximately 6 sccm to approximately 8 sccm) to ensure growth of the type $C_N$ piezoelectric layer 1111.

Beneficially, the type $C_p$ piezoelectric layer 1110 is a highly textured C-axis rare-earth element doped piezoelectric material. Accordingly, the C-axis orientations of the crystals of the type $C_p$ rare-earth element doped piezoelectric material are well-collimated, and as such are parallel with one another (i.e., oriented in the z-direction of the coordinate system depicted in FIG. 11F) and perpendicular to the plane (i.e., the x-y plane of the coordinate system depicted in FIG. 11F) of first lower electrode 1106 over which the type $C_p$ piezoelectric layer 1110 is formed. Similarly, the type $C_N$ piezoelectric layer 1111 is a highly textured C-axis rare-earth element doped piezoelectric material. Accordingly, the C-axis orientations of the crystals of the type $C_N$ rare-earth element doped piezoelectric material are well-collimated, and as such are parallel with one another (i.e., oriented in the −z-direction of the coordinate system depicted in FIG. 11F) and perpendicular to the plane (i.e., the x-y plane of the coordinate system depicted in FIG. 11F) of second lower electrode 1107 over which type $C_p$ piezoelectric layer 1110 is formed.

After formation of the type $C_p$ piezoelectric layer 1110 over the first lower electrode 1106, and a type $C_N$ piezoelectric layer 1111 over the second lower electrode 1107, first and second upper electrodes (not shown) can be formed over the type $C_p$ piezoelectric layer 1110 and the type $C_N$ piezoelectric layer 1111, respectively. These electrodes can then be connected to an electrical power source to provide a variety of BAW resonator devices (e.g., FACT transformers).

The type $C_p$ piezoelectric layer 1110 and the type $C_N$ piezoelectric layer 1111 can be provided immediately next to one another and in contact with one another (i.e., without gap 1108 and layer 1112 between the type $C_p$ and type $C_N$ piezoelectric layers 1110, 1111). This structure can be fabricated through a variation in the processing sequence depicted in FIGS. 11A-11F of the representative embodiments described in connection therewith. Notably, after the formation of the type $C_N$ piezoelectric seed layer 1104 at FIG. 11B, the first electrode layer 1103 is not patterned as described in connection with the processing sequence of FIG. 11D, but rather remains as a single layer. Instead, the type $C_N$ piezoelectric seed layer 1104 is patterned and removed from one side of the first electrode layer 1103, as depicted in FIG. 11G.

Figure 11G:
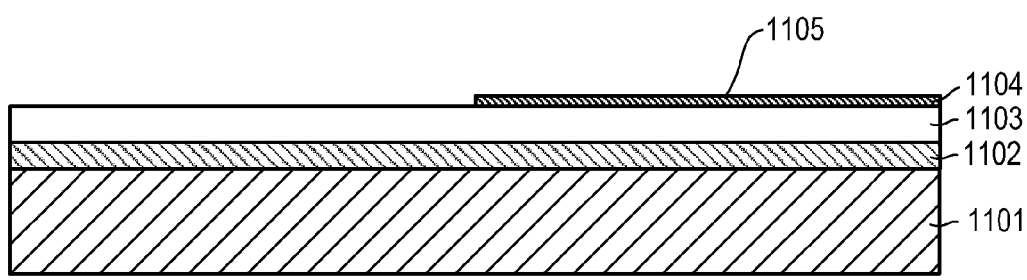

The structure depicted in FIG. 11G is provided in the piezoelectric deposition chamber, hydrogen is flowed at a comparatively high rate (e.g., approximately 16 sccm to approximately 18 sccm) and hydrogen plasma is formed. The flow of hydrogen plasma functions as a cleaning sequence to remove oxides and other contaminants that can form over portion 1105 of the type $C_N$ piezoelectric seed layer 1104 and over the first electrode layer 1103 during the process of patterning the type $C_N$ piezoelectric seed layer 1104.

Figure 11H:
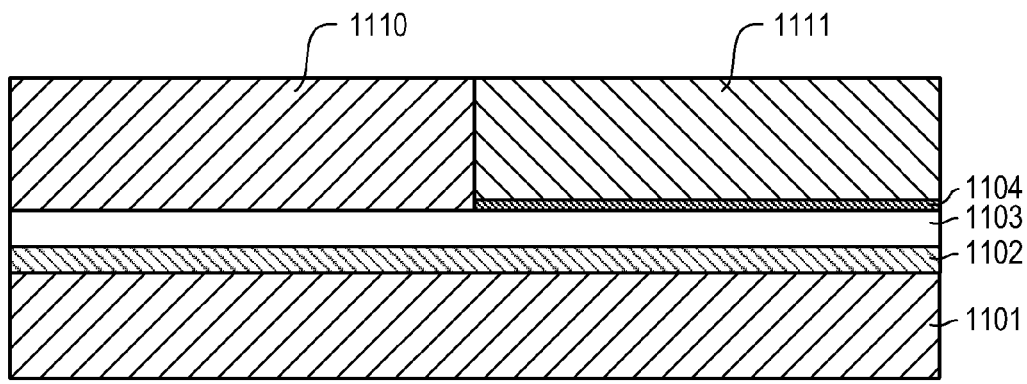

After the cleaning sequence is completed, the flow rate of hydrogen is reduced, and hydrogen plasma activates the portion 1105 of the type $C_N$ piezoelectric seed layer 1104 for growth of type $C_N$ rare-earth element doped piezoelectric material. Next, growth of the highly textured type $C_P$ rare-earth element doped piezoelectric material and highly textured type $C_N$ rare-earth element doped piezoelectric material is effected under conditions conducive to the growth of type $C_P$ rare-earth element doped piezoelectric material, as described in the parent application to Larson. Notably, the growth of the highly textured type $C_P$ rare-earth element doped piezoelectric material and highly textured type $C_N$ rare-earth element doped piezoelectric material occurs with the hydrogen flow continued at a comparatively low flow rate (e.g., approximately 6 sccm to 8 sccm) to maintain growth of the type $C_N$ rare-earth element doped piezoelectric material. As depicted in FIG. 11H, the type $C_P$ piezoelectric layer 1110 is formed immediately next to and in contact with type $C_N$ piezoelectric layer 1111, with both type $C_P$ piezoelectric layer 1110 and type $C_N$ piezoelectric layer 1111 being formed over the first electrode layer 1103.

Although not depicted in FIG. 11H, a second electrode layer is provided over the type $C_P$ piezoelectric layer 1110 and the type $C_N$ piezoelectric layer 1111.

The structure depicted in FIG. 11H may be referred to as a "p/ip" structure such as in the parent application to Burak, et al. The p/ip structure lends itself to improvements in performance in FBAR devices, SBAR devices and CRF devices, as is described in the parent application to Burak, et al. Notably, the process sequence to form the type $C_P$ piezoelectric layer 1110 and the type $C_N$ piezoelectric layer 1111 immediately next to one another and in contact with one another can be repeated to realize p/ip interfaces at other locations and levels of the selected acoustic stack for the desired BAW device.

It is again noted that certain known components of BAW resonator structures (e.g., acoustic reflectors, frame elements and other structures) are contemplated for inclusion in the BAW resonator devices fabricated according to the methods of the representative embodiments. These structures are fabricated according to known methods, and their fabrication is integrated into the overall process flow for fabricating the desired BAW resonator device including the methods of the representative embodiments.

In accordance with illustrative embodiments, methods of fabricating rare-earth element doped piezoelectric materials and acoustic resonators for various applications such as electrical filters are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

I claim:

1. A BAW resonator, comprising:
    a first electrode disposed over a substrate;
    an electropositive seed layer comprising aluminum and scandium (Al—Sc), and disposed over the substrate;
    a piezoelectric layer disposed over the electropositive seed layer and comprising a rare-earth element doped piezoelectric material having a compression-negative ($C_N$) polarity, wherein the electropositive seed layer fosters growth of the piezoelectric layer having the compression-negative ($C_N$) polarity; and
    a second electrode disposed over the rare-earth element doped piezoelectric material.

2. A BAW resonator as claimed in claim 1, wherein the rare-earth element doped piezoelectric material comprises a first component and a second component.

3. A BAW resonator as claimed in claim 2, wherein the rare-earth element is scandium (Sc), the first component is nitrogen (N), and the second component is aluminum (Al).

4. A bulk acoustic wave (BAW) resonator structure, comprising:
    a first electrode disposed over a substrate;
    a first non-ferroelectric piezoelectric layer disposed over the first electrode, the first non-ferroelectric piezoelectric layer having a first c-axis oriented along a first direction, and comprising a rare-earth element doped non-ferroelectric piezoelectric material;
    a second electrode disposed over the first non-ferroelectric piezoelectric layer;
    a second non-ferroelectric piezoelectric layer disposed over the first electrode, the second non-ferroelectric piezoelectric layer being adjacent to, and in direct contact with, the first non-ferroelectric piezoelectric layer, wherein the second non-ferroelectric piezoelectric layer has a second c-axis oriented in a second direction that is substantially antiparallel to the first direction; and
    an acoustic reflector disposed in the substrate.

5. A BAW resonator structure as claimed in claim 4, wherein the second non-ferroelectric piezoelectric layer comprises the rare-earth element doped non-ferroelectric piezoelectric material.

6. A BAW resonator structure as claimed in claim 5, wherein the second non-ferroelectric piezoelectric layer has a piezoelectric coupling coefficient ($e_{33ip}$) that is substantially equal in magnitude but opposite in sign to a piezoelectric coupling coefficient ($e_{33p}$) of the first non-ferroelectric piezoelectric layer.

7. A BAW resonator structure as claimed in claim 5, wherein the rare-earth element doped non-ferroelectric material comprises scandium doped aluminum nitride (AlScN).

8. A bulk acoustic wave (BAW) resonator structure, comprising:
    a first electrode disposed over a substrate;
    a cavity beneath the first electrode;
    a first non-ferroelectric piezoelectric layer disposed over the first electrode, the first non-electric piezoelectric layer comprising a rare-earth element doped non-ferroelectric piezoelectric material, and having a first c-axis oriented along a first direction;
    a second electrode disposed over the first non-ferroelectric piezoelectric layer, wherein an active region of the BAW resonator structure comprises an overlap of the first electrode and the second electrode with the cavity; and
    a second non-ferroelectric piezoelectric layer disposed over the first electrode, the second non-ferroelectric piezoelectric layer being adjacent to, and in direct contact with, the first non-ferroelectric piezoelectric layer, the second non-ferroelectric piezoelectric layer having a second c-axis oriented in a second direction that is substantially antiparallel to the first direction, wherein the second electrode overlaps the second non-ferroelectric piezoelectric layer; and an acoustic reflector disposed in the substrate.

9. A BAW resonator structure as claimed in claim 8, wherein the first non-ferroelectric piezoelectric layer comprises the rare-earth element doped non-ferroelectric piezoelectric material, or the second non-ferroelectric piezoelectric layer comprises the rare-earth element doped non-ferroelectric piezoelectric material, or both.

10. A BAW resonator structure as claimed in claim 9, wherein the second non-ferroelectric piezoelectric layer has a piezoelectric coupling coefficient ($e_{33ip}$) that is substantially equal in magnitude but opposite in sign of a piezoelectric coupling coefficient ($e_{33p}$) of the first non-ferroelectric piezoelectric layer.

11. A BAW resonator structure as claimed in claim 9, wherein the rare-earth element doped non-ferroelectric piezoelectric material comprises scandium doped aluminum nitride (AlScN).

12. A BAW resonator as claimed in claim 1, wherein the electropositive seed layer is comparatively pure.

13. A BAW resonator as claimed in claim 1, wherein the electropositive seed layer is disposed directly on an upper surface of the first electrode.

14. A BAW resonator as claimed in claim 1, wherein a thickness of the electropositive seed layer is in a range of approximately 50 Å to approximately 1000 Å.

15. A BAW resonator as claimed in claim 2, wherein a thickness wherein a thickness of the electropositive seed layer is in a range of approximately 50 Å to approximately 1000 Å.

16. A BAW resonator as claimed in claim 7, wherein atomic percentage of scandium in the scandium doped aluminum nitride (AlScN) is approximately 0.5% to approximately 44%.

17. A BAW resonator as claimed in claim 7, wherein atomic percentage of scandium in the scandium doped aluminum nitride (AlScN) is approximately 2.5% to approximately 5%.

18. A BAW resonator as claimed in claim 7, wherein atomic percentage of scandium in the scandium doped aluminum nitride (AlScN) is approximately 0.5% to less than approximately 10.0%.

19. A BAW resonator as claimed in claim 11, wherein atomic percentage of scandium in the scandium doped aluminum nitride (AlScN) is approximately 0.5% to approximately 44%.

20. A BAW resonator as claimed in claim 11, wherein atomic percentage of scandium in the scandium doped aluminum nitride (AlScN) is approximately 2.5% to approximately 5%.

21. A BAW resonator as claimed in claim 11, wherein atomic percentage of scandium in the scandium doped aluminum nitride (AlScN) is approximately 0.5% to less than approximately 10.0%.

* * * * *